United States Patent
Miyaguchi et al.

(10) Patent No.: US 7,495,529 B2
(45) Date of Patent: Feb. 24, 2009

(54) PHASE SHIFT CIRCUIT, HIGH FREQUENCY SWITCH, AND PHASE SHIFTER

(75) Inventors: Kenichi Miyaguchi, Tokyo (JP); Morishige Hieda, Tokyo (JP); Tamotsu Nishino, Tokyo (JP); Masatake Hangai, Tokyo (JP); Moriyasu Miyazaki, Tokyo (JP); Norihiro Yunoue, Tokyo (JP); Hideki Hatakeyama, Tokyo (JP); Yukihisa Yoshida, Tokyo (JP); Tadashi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 295 days.

(21) Appl. No.: 10/584,187

(22) PCT Filed: Mar. 26, 2004

(86) PCT No.: PCT/JP2004/004243

§ 371 (c)(1),
(2), (4) Date: Jun. 23, 2006

(87) PCT Pub. No.: WO2005/093951

PCT Pub. Date: Oct. 6, 2005

(65) Prior Publication Data

US 2007/0188264 A1   Aug. 16, 2007

(51) Int. Cl.
*H01P 3/00* (2006.01)
*H01P 1/10* (2006.01)

(52) U.S. Cl. ........................ 333/164; 333/101
(58) Field of Classification Search ............... 333/164, 333/156, 101–105; 342/368
See application file for complete search history.

(56) References Cited

U.S. PATENT DOCUMENTS 4,682,128 A * 7/1987 Sproul et al. ............... 333/139

(Continued)

FOREIGN PATENT DOCUMENTS

JP       50-88558 A    12/1975

(Continued)

OTHER PUBLICATIONS

Hantani et al., Bisai Kako Cavity Kozo o Mochiita CPW MEMS Switch no Sekkei, Institute of Electronics, Information and Communication Engineers, Sep. 10, 2003, p. 26.

(Continued)

*Primary Examiner*—James H Cho
(74) *Attorney, Agent, or Firm*—Birch, Stewart, Kolasch & Birch, LLP

(57) ABSTRACT

Provided is a small-size phase shift circuit having a broad band characteristic. The phase shift circuit includes: a first switching element for switching between a through path and a capacitance capacity; a second switching element for switching the capacitance capacity for the through path and the ground; and a first and a second inductor having inductance. One end of the first switching element is connected to one end of the second switching element by the first inductor while the other ends of the first and the second switching element are connected to each other by the second inductor. One end of the first switching element is connected to a high-frequency signal input terminal while the other end of the first switching element is connected to a high-frequency signal output terminal. Thus, it is possible to constitute a phase device satisfying a predetermined condition.

12 Claims, 17 Drawing Sheets

U.S. PATENT DOCUMENTS

| | | | |
|---|---|---|---|
| 5,604,375 | A | 2/1997 | Findikoglu et al. |
| 5,701,107 | A | 12/1997 | Kasahara et al. |
| 5,731,965 | A * | 3/1998 | Cheng et al. ............... 363/41 |
| 6,137,377 | A | 10/2000 | Wallace et al. |
| 2003/0169146 | A1 | 9/2003 | Kawai et al. |
| 2003/0223176 | A1 | 12/2003 | Fujii et al. |

FOREIGN PATENT DOCUMENTS

| | | |
|---|---|---|
| JP | 1-202007 A | 8/1989 |
| JP | 2-151113 A | 6/1990 |
| JP | 1995-033026 | 6/1995 |
| JP | 8-46253 A | 2/1996 |
| JP | 8-250963 A | 9/1996 |
| JP | 2000-294104 A | 10/2000 |
| JP | 2003-258502 A | 9/2003 |
| JP | 2003-264122 A | 9/2003 |
| JP | 2004-048176 A | 2/2004 |

OTHER PUBLICATIONS

Hantani et al., Bisai Kako Cavity Kozo o Mochiita CPW MEWS Switch no Sekkei, Institute of Electronics, Information and Communication Engineers, Sep. 10, 2003, p. 26.

Wallace et al., Low Cost MMIC DBS Chip Sets for Phased Array Applications, IEEE, 1999, pp. 1-4, 0-7803-5135-5/99, no month.

Campbell et al., A Compact 5-Bit Phase Shifter MMIC for K-Band Satellite Communication Systems, IEEE, 2000, pp. 1-4, 0-7803-5687-X/00, no month.

* cited by examiner

PHASE SHIFT CIRCUIT, HIGH FREQUENCY SWITCH, AND PHASE SHIFTER

TECHNICAL FIELD

The present invention relates to a downsized phase shift circuit having a broadband phase shift amount characteristic, and a high frequency switch and a phase shifter which are used for the phase shift circuit.

BACKGROUND ART

FIG. 31 is a circuit diagram showing a phase shift circuit disclosed in U.S. Pat. No. 6,137,377 as a first conventional example.

In the phase shift circuit shown in FIG. 31, a first field effect transistor (hereinafter referred to as "FET") 1.03 operates as a switch for switching between an on state and an off state, and a first bias terminal 118 is connected to a gate electrode of the first field effect transistor through a first resistor 113.

When a potential same as that of a drain voltage and a source voltage of the FET 103 is applied to the bias terminal 118, the FET 103 turns on and exhibits a resistivity (hereinafter referred to as "on resistance").

On the other hands, when a gate voltage equal to or lower than a pinch off voltage is applied to the bias terminal 118, the FET 103 turns off and exhibits a capacitivity (hereinafter referred to as "off capacitance"). An FET 104 and an FET 105 operate in the same manner as the FET 103.

A first resistor 113, a second resistor 114, a third resistor 115, a fourth resistor 116, and a fifth resistor 117 have such a sufficiently large resistance that a high frequency signal inputted from a high frequency signal input terminal 101 cannot pass through the resistors.

A voltage (disclosed as −5V in U.S. Pat. No. 6,137,377) equal to or lower than the pinch off voltage is constantly applied to a bias terminal 118 and a bias terminal 120. A voltage of 0 V or equal to or lower than the pinch off voltage is applied to a bias terminal 119.

Subsequently, a description will be given of an operation of the phase shift circuit shown in FIG. 31.

FIG. 32 is an equivalent circuit diagram in which a voltage equal to or lower than the pinch off voltage is applied to the bias terminal 119. In this situation, the FET 103 turns on and exhibits an on resistance 122, and the FET 105 turns off and exhibits an off capacitance 123.

The circuit shown in FIG. 32 can be regarded as a high pass filter (hereinafter referred to as "HPF") which is composed of a first capacitor 109, a second capacitor 110, a first inductor 106, and a second inductor 107. The HPF causes a signal inputted from the high frequency signal input terminal 101 to have a phase lead, and the signal is then outputted from a high frequency signal output terminal 102.

Also, FIG. 33 is an equivalent circuit diagram in which 0 V is applied to the bias terminal 119. In this situation, the FET 103 turns off and exhibits an off capacitance 124, the FET 104 turns off and exhibits an off capacitance 125, and the FET 105 turns on and exhibits an on resistance 126.

The circuit shown in FIG. 33 can be regarded as a low pass filter (hereinafter referred to as "LPF") which is composed of the first inductor 106, the second inductor 107, and the off capacitance 125. The LPF causes a signal inputted from the high frequency signal input terminal 101 to have a phase delay, and the signal is then outputted from the high frequency signal output terminal 102.

A difference between the phase lead that is caused by the HPF and the phase delay that is caused by the LPF corresponds to a required phase shift amount. When the voltage of 0 V, or equal to or lower than the pinch off voltage is applied to the bias terminal 119, the signal inputted from the high frequency signal input terminal 101 switches over the respective on/off state of the FET 103, the FET 104, and the FET 105 according to the voltage applied to the bias terminal 119, to thereby obtain a desired phase shift amount, and the signal is outputted from the high frequency signal output terminal 102. In other words, of the bias terminals, the bias terminal 119 is the only one that gives a control signal for switching each of the states of HPF and LPF.

Then, FIG. 34 is a circuit diagram showing a phase shift circuit according to a second conventional example disclosed in IEEE IMS2000 Proceedings, "A Compact 5-Bit Phase Shifter MMIC for K-Band Satellite Communication Systems".

In the phase shift circuit shown in FIG. 34, a first FET 127 operates as a switch for switching between the on state and the off state, and when a voltage of a potential same as that of a drain voltage and a source voltage of the first FET 127 is applied to a gate terminal of the first FET 127, the first FET 127 turns on, and exhibits the resistivity (hereinafter referred to as "on resistance"). On the other hand, when a voltage equal to or lower than the pinch off voltage is applied to the gate terminal, the first FET 127 turns off and exhibits the capacitivity (hereinafter referred to as "off capacitance"). A second FET 128 also operates in the same manner as the first FET 127.

Subsequently, a description will be given of an operation of the phase shift circuit shown in FIG. 34.

FIG. 35 is an equivalent circuit diagram when the first FET 127 is turned off and the second FET 128 is turned on. A capacity 134 exhibits a synthetic capacity of the off capacitance of the first FET 127 and the capacitor 132, and a resistor 135 exhibits the on resistance of the second FET 128. In this situation, the circuit shown in FIG. 35 can be regarded as a high pass filter (hereinafter referred to as "HPF") which is composed of a synthetic capacity 134, a first inductor 129, and a second inductor 130. The HPF causes a signal inputted from the high frequency signal input terminal 101 to have a phase lead, and the signal is then outputted from the high frequency signal output terminal 102.

Also, FIG. 36 is an equivalent circuit diagram when the first FET 127 is turned on and the second FET 128 is turned off. A resistor 136 exhibits the on resistance of the first FET 127, and a capacity 137 exhibits the off capacitance of the second FET 128. A parallel circuit composed of the third inductor 131 and the off capacitance 137 enters a parallel resonance state at a desired frequency $f_0$.

In this situation, the circuit shown in FIG. 36 can be regarded as a band pass filter (hereinafter referred to as "BPF") which allows a high frequency signal in the vicinity of the frequency $f_0$ to pass therethrough when reactances of the first inductor 129 and of the second inductor 130 are sufficiently large. The BPF causes a signal inputted from the high frequency signal input terminal 101 to have a phase changed by substantially 0, and the signal is then outputted from the high frequency signal output terminal 102.

A difference between the phase lead caused by the HPF and the phase change caused by the BPF corresponds to a required phase shift amount. The signal inputted from the high frequency signal input terminal 101 switches between the respective on/off state of the first FET 127 and the second FET 128, to thereby obtain a desired phase shift amount, and is outputted from the high frequency signal output terminal 102.

As described above, the phase shift circuit according to the first conventional example shown in FIG. 31 involves such a problem that a large number of circuit structural elements included in the circuit leads to an increased size thereof.

Also, the phase shift circuit according to the second conventional example shown in FIG. 34 involves such a problem that a phase shift amount that is equal to or higher than 90° is not obtained because the phase circuit has a structure in which the states of the HPF and the BPF are switched. In addition, it is necessary to set a cutoff frequency of the HPF to be lower than a desired frequency band, which leads to such a problem that the circuit is increased in size as the frequency becomes lower. Also, it is necessary to set the cutoff frequency of the HPF to be lower as the phase shift amount becomes smaller, which leads to an increased size of the circuit.

The present invention has been made to solve the above problems, and therefore has an object to provide a phase shift circuit which is downsized and has a broadband characteristic, and a high frequency switch and a phase shifter which are used for the phase shift circuit.

DISCLOSURE OF THE INVENTION

A phase shift circuit according to the present invention includes: a first switching element for switching between a through path and a capacitor of a capacitance $C_1$; a second switching element for switching between a through path and a capacitor of a capacitance $C_2$ with respect to a ground; and first and second inductors each having an inductance L, in which one ends of the first and second switching elements are connected to each other through the first inductor, the other ends of the first and second switching elements are connected to each other through the second inductor, the one end of the first switching element is connected to a high frequency signal input terminal, the other end of the first switching element is connected to a high frequency signal output terminal, and following expressions are satisfied assuming that a characteristic impedance of the high frequency signal input terminal and the high frequency output terminal is $Z_0$:

$$C_2 = 4C_1 \quad (1)$$

$$Z_0 = (L/2C_1)^{1/2} \quad (2).$$

Also, the phase shift circuit is characterized in that the first switching element is constituted by a switching element that is indicative of a through state at a time of on and a capacitivity at a time of off, the second switching element is constituted by a parallel circuit in which an inductor is connected in parallel with a switching element that is indicative of a through state at the time of on and a capacitivity at the time of off, and a series circuit composed of the parallel circuit and the capacitance of the capacitor, and one end of the series circuit is connected to the ground, and the other end of the series circuit is connected to the other ends of the first end second inductors.

Also, the phase shift circuit is characterized in that the capacitance of the capacitor is constituted by a switching element indicative of the through state at the time of on and the capacitivity at the time of off.

Also, the phase shift circuit is characterized in that the parallel circuit is replaced with a switching element indicative of the through state at the time of on and the capacitivity at the time of off.

Also, the phase shift circuit is characterized in that the switching element indicative of the through state at the time of on and the capacitivity at the time of off is replaced with a parallel circuit that includes a switching element indicative of the through state at the time of on and the capacitivity at the time of off, and a capacitor.

Also, a high frequency switch according to the present invention includes: a first conductor and a control electrode that are formed on a bottom surface of a cavity embedded in only one surface of a substrate; a dielectric support film that is supported by end portions of the cavity and exists in a hollow through an air layer; a pair of high frequency signal transmission lines formed to be apart from each other at an interval on the support film surface; and a second conductor that is disposed on the rear surface of the support film and forms a parallel plane capacitor between the pair of high frequency signal transmission paths, in which each of the pair of high frequency signal transmission lines has a conductive projection penetrating a part of the support film, and when a voltage is applied to the control electrode, the support film is displaced toward the bottom surface of the cavity, and each of the conductive projections is brought in contact with the first conductor to provide a through state, such that a through/series capacitance switching element that is mechanically driven is structured.

Also, a high frequency switch according to another invention includes: a ground conductor and a control electrode which are formed on a bottom surface of a cavity embedded in only one surface of a substrate; a dielectric support film that is supported by end portions of the cavity and exists in a hollow through an air layer; and a high frequency signal transmission line that is formed on the support film surface, in which when a voltage is applied to the control electrode, the support film is displaced toward the bottom surface of the cavity and the support film is brought in contact with the ground conductor to provide a state indicative of the capacitance with respect to the ground, such that a through/series capacitance switching element that is mechanically driven is structured.

Also, a high frequency switch according to further another invention includes: a pair of high frequency signal transmission lines formed to be apart from each other at an interval on a bottom surface of a cavity that is embedded in only one surface of a substrate and have a conductive projection, respectively; a dielectric film that is formed on the pair of high frequency signal transmission lines to extend across the pair of high frequency signal transmission lines; a first conductor formed on the dielectric film; a dielectric support film supported by end portions of the cavity and exists in a hollow through an air layer; a second conductor formed on a rear surface of the support film; and a control electrode formed on the support film surface, in which when a voltage is applied to the control electrode, the support film is displaced toward the bottom surface of the cavity and the second conductor is brought in contact with the respective conductive projections to provide a through state, such that a through/series capacitance switching element that is mechanically driven is structured.

Also, a high frequency switch according to still further another invention includes: a high frequency signal transmission line that is formed on a bottom surface of a cavity embedded in only one surface of a substrate; a dielectric support film that is supported by end portions of the cavity and exists in a hollow through an air layer; and a ground conductor and a control electrode that are formed on the support film surface, in which when a voltage is applied to the control electrode, the support film is displaced toward the bottom surface of the cavity, and the support film is brought in contact with the high frequency signal transmission line to provide a state indicative of a capacitance with respect to the ground, such that a through/series capacitance switching element that is mechanically driven is structured.

Also, a phase shift circuit according to the present invention is characterized in that the first switching element is composed of a high frequency switch that constitutes the through/series capacitance switching element, and the second switching element is composed of a high frequency switch that constitutes the through/shunt capacitance switching element.

Further, a phase shifter according to the present invention is characterized in that the above-mentioned phase sift circuits are combined together to constitute a multi-bit phase shifter.

BRIEF DESCRIPTION OF THE DRAWINGS

FIG. 35 is an equivalent circuit diagram in which a first FET 127 of FIG. 34 is turned off, and a second FET 128 of FIG. 34 is turned on.

BEST MODES FOR CARRYING OUT THE INVENTION

First Embodiment

Figure 1:
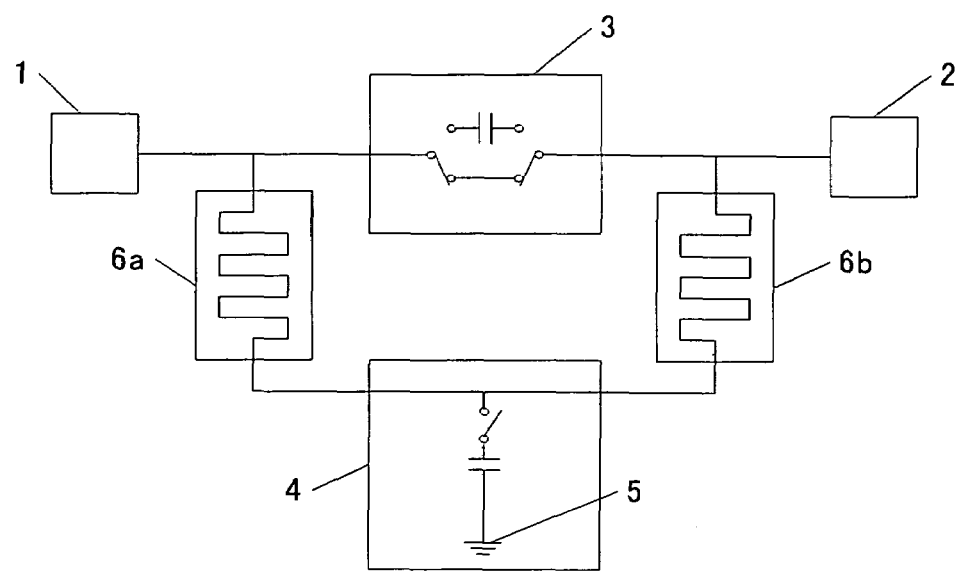
FIG. 1 is a circuit diagram showing a structure of a phase shift circuit according to a first embodiment of the present invention.

FIG. 1 is a circuit diagram showing a structure of a phase shift circuit according to a first embodiment of the present invention. The phase shift circuit shown in FIG. 1 includes, between a high frequency signal input terminal 1 and a high frequency signal input/output terminal 2, a first switching element 3 for switching between a through path and the capacity of a capacitance $C_1$, a second switching element 4 for switching between the through path and the capacity of a capacitance $C_2$ with respect to a ground, a first inductor 6a, and a second inductor 6b. Reference numeral 5 denotes the ground.

Subsequently, a description will be given of the operation of the phase shift circuit shown in FIG. 1.

Figure 2:
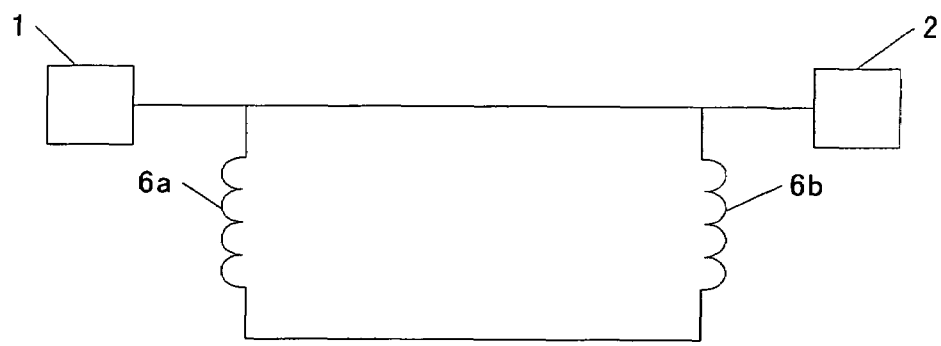
FIG. 2 is an equivalent circuit diagram in which a first switching element 3 of FIG. 1 is in a through state and a second switching element 4 of FIG. 1 is in a through state.

FIG. 2 is an equivalent circuit diagram when a first switching element 3 is in a through state and a second switching element 4 is in a through state. In this example, when it is assumed that the reactance of the first inductor 6a and the second inductor 6b is sufficiently large, the circuit shown in FIG. 2 can be regarded as a through circuit. Accordingly, a signal that is inputted from the high frequency signal input terminal 1 is outputted from the high frequency signal output terminal 2 without producing a phase change. In this situation, there is no reflection loss because the through circuit is matched in all of the frequencies.

Figure 3:
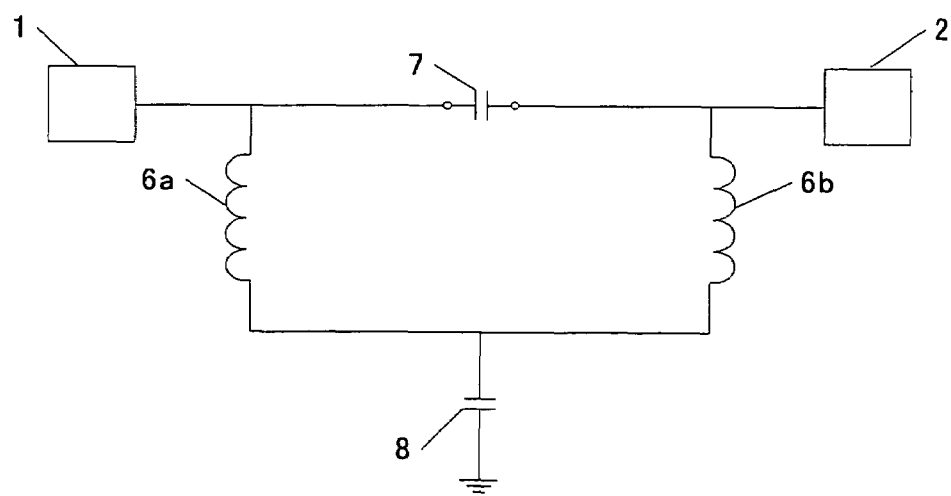
FIG. 3 is an equivalent circuit diagram in which the first switching element 3 is in a state indicative of a capacitivity and the second switching element 4 is in a state indicative of a capacitivity with respect to the ground.

FIG. 3 is an equivalent circuit diagram when the first switching element 3 is in a state indicative of the capacitivity, and the second switching element 4 is in a state indicative of the capacitivity with respect to the ground. The circuit shown in FIG. 3 can be regarded as an all pass network that is composed of the first inductor 6a, the second inductor 6b, a first capacitor 7, and a second capacitor 8, the first capacitor 3 exhibiting a capacitivity to form the first capacitor 7, the second switching element 4 also exhibiting a capacitivity to form the second capacitor 8. As a result, the signal that is inputted from the high frequency signal input terminal 1 is outputted from the high frequency signal output terminal 2 with a phase delay caused by the all pass network.

In this example, it is assumed that the following expressions (1) and (2) are satisfied when the capacitance of the first capacitor 7 is $C_1$, the capacitance of the second capacitor 8 is $C_2$, the inductance of the first inductor 6a and the second inductor 6b is L, and the characteristic impedance of the high frequency signal input terminal 1 and the high frequency signal output terminal 2 are $Z_0$.

$$C_2 = 4C_1 \quad (1)$$

$$Z_0 = (L/2C_1)^{1/2} \quad (2)$$

In this situation, there is no reflection loss because the all pass network is matched in all of the frequencies. In addition, the capacitance $C_1$ (or $C_2$) is appropriately set, thereby making it possible to obtain a desired phase delay.

As described above, the phase shift circuit according to the first embodiment shown in FIG. 1 switches between the through state and the all pass network state due to the switching operation of the first switching element 3 and the switching operation of the second switching element 4, and changes a pass phase that occurs when the signal which is inputted from the high frequency signal input terminal 1 is outputted to the high frequency signal output terminal 2.

Therefore, according to the phase shift circuit of the first embodiment, the inductance L, the capacitance C1, and the capacitance C2 are appropriately set, thereby making it possible to obtain a desired phase shift amount over a broadband. In other words, there is obtained the phase shift circuit that operates over the broader band than the conventional example.

Second Embodiment

Figure 4:
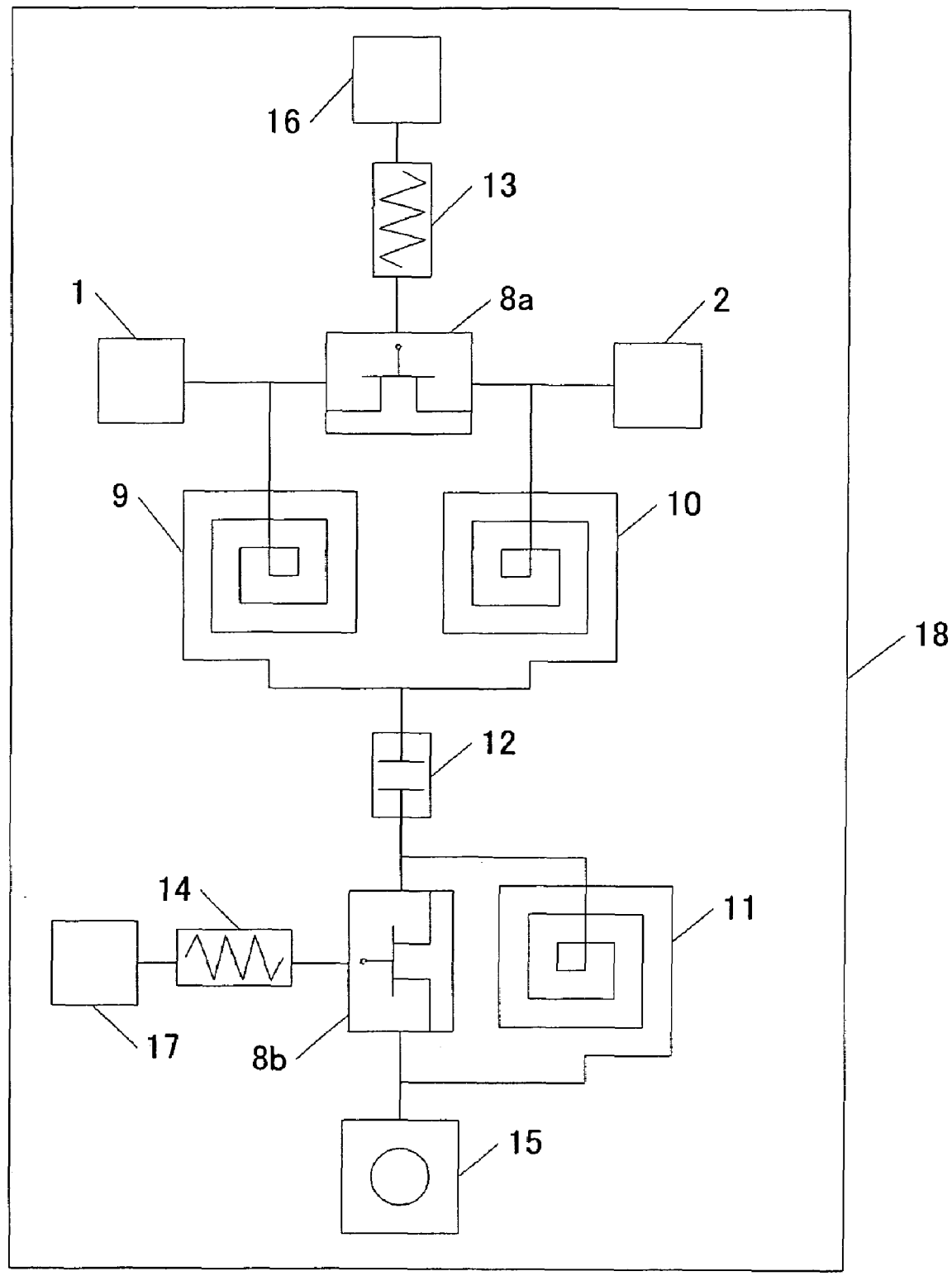
FIG. 4 is a circuit diagram showing a structure of a phase shift circuit according to a second embodiment of the present invention.

FIG. 4 is a circuit diagram showing a structure of a phase shift circuit according to a second embodiment of the present invention. Referring to FIG. 4, the same parts as or the corresponding parts to those shown in FIG. 1 are denoted by identical reference symbols, and their duplex descriptions will be omitted. The phase shift circuit shown in FIG. 4 is structured on a semiconductor substrate 18 in a monolithic fashion, and correspondences of the respective structural elements shown in FIG. 4 to the respective structural elements shown in FIG. 1 are stated below. That is, a first FET 8a corresponds to the first switch element 3, a second FET 8b corresponds to the second switching element 4, a first spiral inductor 9 corresponds to the first inductor 6a, and a second spiral inductor 10 corresponds to the second inductor 6b, respectively.

A control electrode of the first FET 8a is connected with a first control signal terminal 16 through a first resistor 13, and a control electrode of the second FET 8b is connected with a second control signal terminal 17 through a second resistor 14. Also, the second FET 8b is connected in parallel with a third spiral inductor 11 to constitute a parallel circuit, and the parallel circuit is connected in series to an MIM capacitor 12 to constitute a series circuit. One end of the series circuit is connected to the ground through a through hole 15, and the other end of the series circuit is connected to a node between the first and second spiral inductors 9 and 10.

Figure 5:
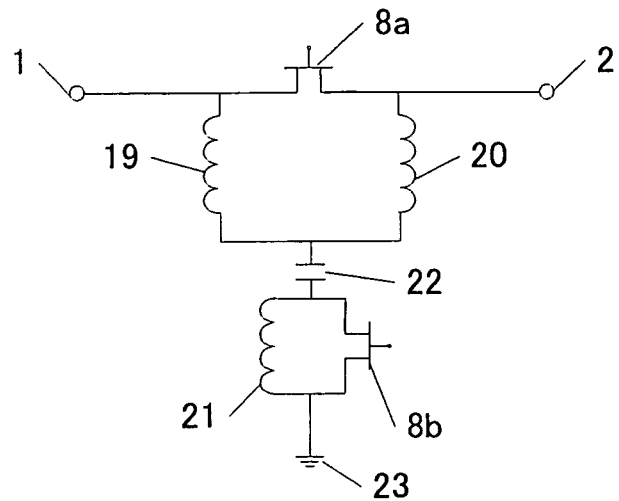
FIG. 5 is an equivalent circuit diagram showing a phase shift circuit according to the second embodiment of the present invention.

FIG. 5 is an equivalent circuit diagram showing a phase shift circuit according to the second embodiment shown in FIG. 4. In the equivalent circuit shown in FIG. 5, the same parts as or the corresponding parts to those shown in FIG. 4 are denoted by identical reference symbols, and their duplex descriptions will be omitted. An inductor 19 corresponds to the spiral inductor 9, an inductor 20 corresponds to the second spiral inductor 10, an inductor 21 corresponds to the third spiral inductor 11, a capacitor 22 corresponds to the MIM capacitor 12, and a ground 23 corresponds to the through hole 15, respectively.

The FET 8a and the FET 8b function as switches for switching over the on/off states. In the FET 8a, when a voltage of the same potential as the drain voltage and the source voltage is applied to the gate terminal, the FET 8a becomes in an on state and exhibits the resistivity (hereinafter referred to as "on resistance"). On the other hand, when a voltage that is equal to or lower than the pinch off voltage is applied to the gate terminal, the FET 8a becomes in an off state and exhibits the capacitivity (hereinafter referred to as "off capacitance"). The FET 8b also conducts the same operation.

Subsequently, a description will be given of the operation of the phase shift circuit according to the second embodiment with reference to FIG. 5 that is an equivalent circuit diagram of FIG. 4.

Figure 6:
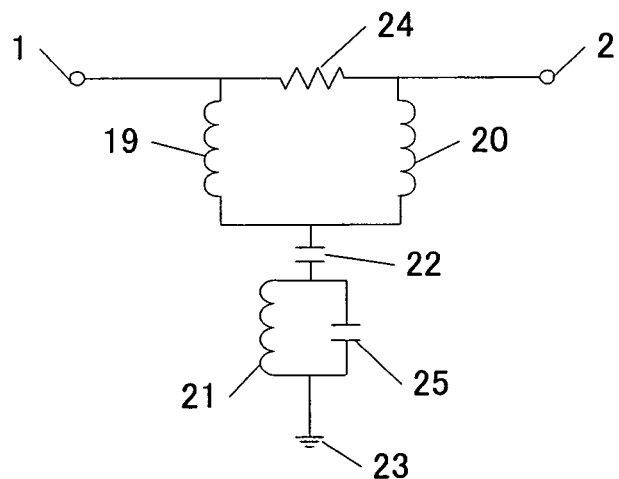
FIG. 6 is an equivalent circuit diagram in which an FET 8a of FIG. 5 is in an on state and an FET 8b of FIG. 5 is in an off state.

FIG. 6 is an equivalent circuit diagram when the FET 8a is in an on state and the FET 8b is in an off state in FIG. 5. As shown in FIG. 6, the FET 8a is expressed as an on resistance 24 in an on state, and the FET 8b is expressed as an off capacitance 25 in an off state.

In this example, a parallel circuit composed of the inductor 21 and the off capacitance 25 is set in a parallel resonance (open) state at a desired frequency fo. Also, since a reactance caused by the inductor 19 and the inductor 20 is sufficiently large, the circuit shown in FIG. 6 can be regarded as a band pass filter circuit that has frequencies in the vicinity of the desired frequency $f_0$ as a pass band. When the on resistance 24 is sufficiently small, the phase change hardly occurs. Therefore, at the desired frequency fo, the signal that is inputted from the high frequency signal input terminal 1 is outputted from the high frequency signal output terminal 2 with no phase change.

Figure 7:
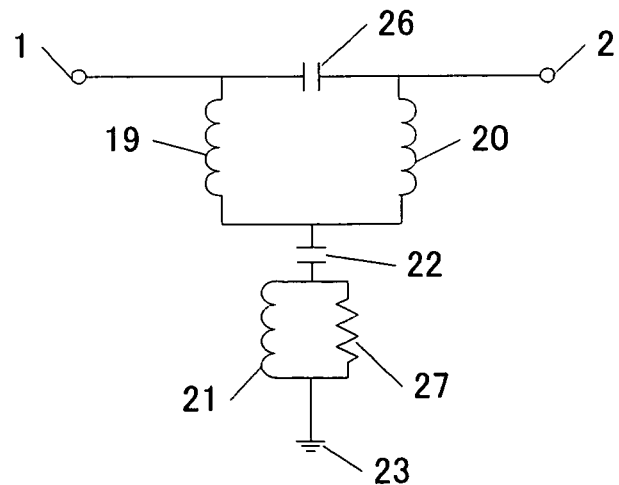
FIG. 7 is an equivalent circuit diagram in which the FET 8a of FIG. 5 is in an off state and the FET 8b of FIG. 5 is in an on state.

FIG. 7 is an equivalent circuit diagram when the FET 8a is in an off state and the FET 8b is in an on state in FIG. 5. As shown in FIG. 7, the FET 8a is expressed as an off capacitance 26 in an off state, and the FET 8b is expressed as an on resistance 27 in an on state.

In this example, when the reactance caused by the inductor 21 is sufficiently larger than the on resistance 27, a parallel circuit composed of the on resistance 27 and the inductor 21 can be regarded as a circuit composed of only the on resistance 27. Accordingly, the circuit shown in FIG. 7 can be regarded as an all pass network that is composed of the inductor 19, the inductor 20, the off capacitance 26, and the capacitor 22. Therefore, the signal that is inputted from the high frequency signal input terminal 1 is outputted from the high frequency signal output terminal 2 with a phase delay which is caused by the all pass network.

In this example, it is assumed that the expression (1) and the expression (2) are satisfied when the capacitance of the off capacitance 26 is $C_1$, the capacitance of the capacitor 22 is $C_2$, the inductance of the inductor 19 and the inductor 20 is L, and the characteristic impedance of the high frequency signal input terminal 1 and the high frequency signal output terminal 2 are $Z_0$. In this case, there is no reflection loss because the all pass network is matched in all of the frequencies. In addition, the capacitance $C_1$ (or $C_2$) is appropriately set, thereby making it possible to obtain a desired phase delay at a desired frequency.

As described above, the phase shift circuit according to the second embodiment shown in FIG. 4 switches between the band pass filter circuit and the all pass network due to the on/off switching operation of the FET 8a and the FET 8b to change the pass phase from the high frequency signal input terminal 1 to the high frequency signal output terminal 2.

Therefore, in the phase shift circuit according to the second embodiment of the present invention, a desired phase shift amount can be obtained by a change in the pass phase. In other words, because the circuit can be structured by two FETs, three inductors, one capacitor, and one through hole, the circuit is downsized as compared with the first conventional example.

Also, in the second conventional example, it is necessary that the cutoff frequency of the high pass filter is set to be lower than a desired center frequency. However, because the cutoff frequency (a frequency at which the characteristic of the low pass filter and the characteristic of the high pass filter switch from one to another) of the all pass network is higher than the desired center frequency, the inductance and the capacitance can be reduced as compared with those in the second conventional example, to thereby make it possible to downsize the circuit.

Also, since the all pass network is matched in all of the frequencies by appropriately setting the circuit constant, the phase shift circuit is broadened in the band as compared with the first and second conventional examples.

Also, a change in pass phase which is obtained by the low pass filter and the high pass filter is 90° at the maximum. However, since the all pass network is matched in all of the frequencies by appropriately setting the circuit constant, an arbitrary pass phase change, that is, an arbitrary phase shift amount can be obtained.

In the phase shift circuit according to the second embodiment shown in FIG. 4, the FET 8a and the FET 8b are used as the switching elements. However, an element of any type can be applied as long as the element has a switching function that is capable of switching over the on/off states.

Also, the phase shift circuit according to the second embodiment shown in FIG. 4 is structured on the semiconductor substrate 18 in a monolithic fashion. Alternatively, it is possible that a passive element is formed on a dielectric substrate, an active element is formed on a semiconductor substrate, and both of those substrates are electrically connected to each other by a metal wire, a metal bump, or the like to constitute a phase shift circuit.

Third Embodiment

Figure 8:
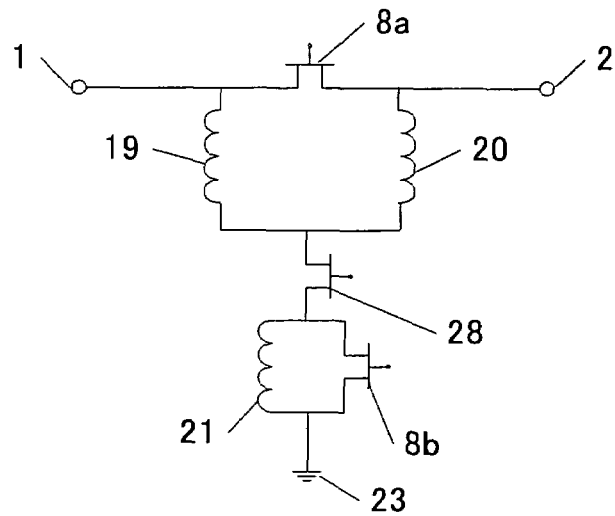
FIG. 8 is a circuit diagram showing a structure of a phase shift circuit according to a third embodiment of the present invention.

FIG. 8 is a circuit diagram showing a structure of a phase shift circuit according to a third embodiment of the present invention. Referring to FIG. 8, the same parts as or the corresponding parts to those shown in FIG. 5 are denoted by identical reference symbols, and their duplex descriptions will be omitted. In the phase shift circuit according to the third embodiment shown in FIG. 8, the capacitor 22 in the phase shift circuit according to the second embodiment shown in FIG. 5 is replaced with an FET 28. The FET 28 functions as a switch for switching the on/off state, and conducts the same operation as the FET 8a and the FET 8b.

Subsequently, a description will be given of the operation of the phase shift circuit according to the third embodiment.

Figure 9:
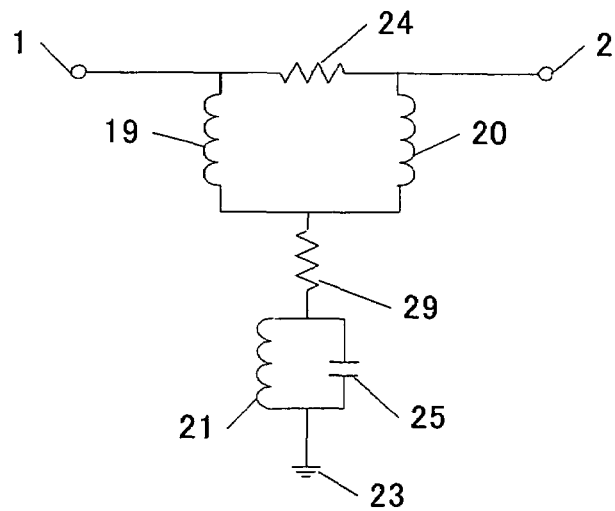
FIG. 9 is an equivalent circuit diagram in which the FET 8a of FIG. 8 is in an on state, the FET 8b of FIG. 8 is in an off state and the FET 28 of FIG. 8 is in an on state.

FIG. 9 is an equivalent circuit diagram when the FET 8a is in an on state, the FET 8b is in an off state, and the FET 28 is in an on state in FIG. 8. As shown in FIG. 9, the FET 8a is expressed as an on resistance 24 in an on state, the FET 8b is expressed as an off capacitance 25 in an off state, and the FET 28 is expressed as an on resistance 29 in an on state.

In this example, as an equivalent circuit diagram shown in FIG. 6, a parallel circuit composed of the inductor 21 and the off capacitance 25 is set in a parallel resonance (open) state at a desired frequency $f_0$. Since a reactance caused by the inductor 19 and the inductor 20 is sufficiently large, the circuit shown in FIG. 9 can be regarded as a band pass filter circuit that has frequencies in the vicinity of the desired frequency $f_0$ as a pass band. When the on resistance 24 is sufficiently small, the phase change hardly occurs. Therefore, at the desired frequency $f_0$, the signal that is inputted from the high frequency signal input terminal 1 is outputted from the high frequency signal output terminal 2 with no phase change.

The equivalent circuit shown in FIG. 6 has a series circuit that is mainly composed of the inductor 19, the inductor 21, and the capacitor 22, which may be in a series resonance state at a frequency lower than the desired frequency $f_0$, and may affect the characteristic of the phase shift circuit in the vicinity of $f_0$. However, the circuit shown in FIG. 9 has the capacitor 22 replaced with the on resistance 29 so as to prevent series resonance, thereby not affecting the characteristic of the phase shift circuit in the vicinity of $f_0$ with an excellent characteristic.

Figure 10:
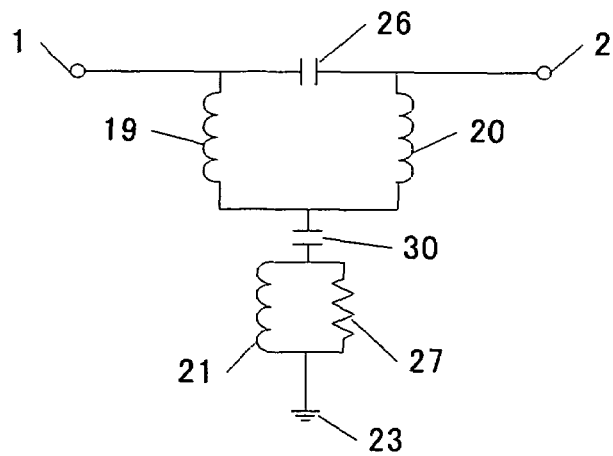
FIG. 10 is an equivalent circuit diagram in which the FET 8a of FIG. 8 is in an off state, the FET 8b of FIG. 8 is in an on state, and the FET 28 of FIG. 8 is in an off state.

FIG. 10 is an equivalent circuit diagram when the FET 8a is in an off state, the FET 8b is in an on state, and the FET 28 is in an off state in FIG. 8. As shown in FIG. 10, the FET 8a is expressed as an off capacitance 26 in an off state, the FET 8b is expressed as an on resistance 27 in an on state, and the FET 28 is expressed as an off capacitance 30 in an off state.

In this example, as an equivalent circuit diagram shown in FIG. 7, when the reactance caused by the inductor 21 is sufficiently larger than the on resistance 27, a parallel circuit composed of the on resistance 27 and the inductor 21 can be regarded as a circuit composed of only the on resistance 27. Accordingly, the circuit shown in FIG. 10 can be regarded as an all pass network that is composed of the inductor 19, the inductor 20, the off capacitance 26, and the off capacitance 30. Therefore, the signal that is inputted from the high frequency signal input terminal 1 is outputted from the high frequency signal output terminal 2 with a phase delay which is caused by the all pass network.

In this example, it is assumed that the expression (1) and the expression (2) are satisfied when the capacitance of the off capacitance 26 is $C_1$, the capacitance of the off capacitance 30 is $C_2$, the inductance of the inductor 19 and the inductor 20 is L, and the characteristic impedance of the high frequency signal input terminal 1 and the high frequency signal output terminal 2 are $Z_0$. In this case, there is no reflection loss because the all pass network is matched in all of the frequencies. In addition, the capacitance $C_1$ (or $C_2$) is appropriately set, thereby making it possible to obtain a desired phase delay at a desired frequency.

As described above, the phase shift circuit according to the third embodiment shown in FIG. 8 switches between the band pass filter circuit and the all pass network due to the on/off switching operation of the FET 8a, the FET 8b, and the FET 28 to change the pass phase from the high frequency signal input terminal 1 to the high frequency signal output terminal 2.

Therefore, in the phase shift circuit according to the third embodiment, the same effects as those in the phase, shift circuit according to the second embodiment can be obtained. Also, because the series resonance at the frequency that is equal to or lower than the desired frequency $f_0$ does not occur in the state of the band pass filter circuit, there is an advantage in that the phase shift circuit does not affect the characteristic of the phase shift circuit in the vicinity of $f_0$.

In the phase shift circuit according to the third embodiment shown in FIG. 8, the FET 8a, FET 8b, and the FET 28 are used as the switching elements. However, an element of any type can be applied as long as the element has a switching function that is capable of switching over the on/off states.

Also, the phase shift circuit according to the third embodiment shown in FIG. 8 may be structured on the semiconductor substrate in a monolithic fashion. Alternatively, it is possible that a passive element is formed on a dielectric substrate, an active element is formed on a semiconductor substrate, and both of those substrates are electrically connected to each other by a metal wire, a metal bump, or the like to constitute a phase shift circuit.

Fourth Embodiment

Figure 11:
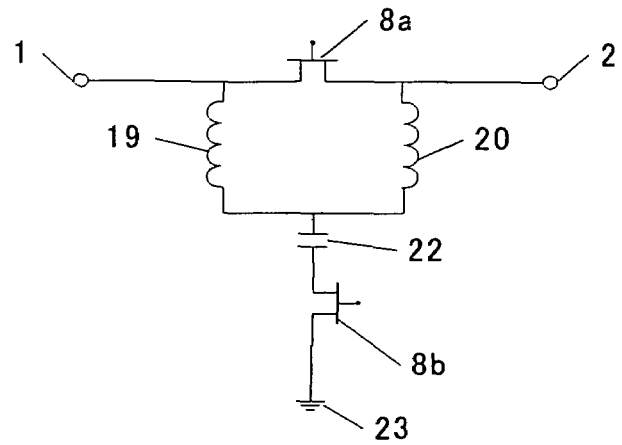
FIG. 11 is a circuit diagram showing a structure of a phase shift circuit according to a fourth embodiment of the present invention.

FIG. 11 is a circuit diagram showing a structure of a phase shift circuit according to a fourth embodiment of the present invention. Referring to FIG. 11, the same parts as or the corresponding parts to those shown in FIG. 5 are denoted by identical reference symbols, and their duplex descriptions will be omitted. In the phase shift circuit according to the fourth embodiment shown in FIG. 11, the parallel circuit composed of an inductor 21 and an FET 8b in the phase shift circuit according to the second embodiment shown in FIG. 5 is replaced only with the FET 8b.

Subsequently, a description will be given of the operation of the phase shift circuit according to the fourth embodiment.

Figure 12:
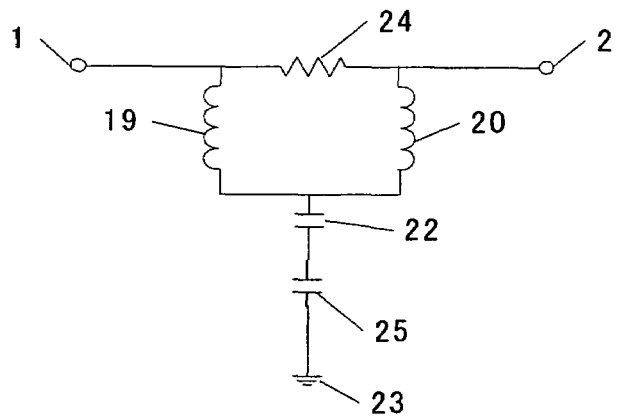
FIG. 12 is an equivalent circuit diagram in which the FET 8a of FIG. 11 is in an on state and the FET 8b of FIG. 11 is in an off state.

FIG. 12 is an equivalent circuit diagram when the FET 8a is in an on state and the FET 8b is in an off state in FIG. 11. As shown in FIG. 12, the FET 8a is expressed as an on resistance 24 in an on state, and the FET 8b is expressed as an off capacitance 25 in an off state.

In this example, the synthetic capacity of the capacitor 22 and the off capacitance 25 is set in a substantially open state. Also, the circuit shown in FIG. 12 can be regarded as a through circuit caused by the on resistance 24 since the reactance of the inductor 19 and the inductor 20 is sufficiently large. When the on resistance 24 is sufficiently small, the phase change hardly occurs. Therefore, the signal that is inputted from the high frequency signal input terminal 1 is outputted from the high frequency signal output terminal 2 with no phase change.

Figure 13:
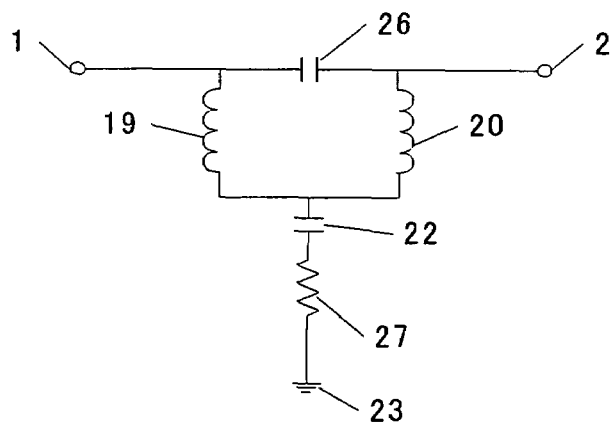
FIG. 13 is an equivalent circuit diagram in which the FET 8a of FIG. 11 is in an off state and the FET 8b of FIG. 11 is in an on state.

FIG. 13 is an equivalent circuit diagram when the FET 8a is in an off state and the FET 8b is in an on state in FIG. 11. As shown in FIG. 13, the FET 8a is expressed as an off capacitance 26 in an off state, and the FET 8b is expressed as an on resistance 27 in an on state. Accordingly, the circuit shown in FIG. 13 can be regarded as an all pass network that is composed of the inductor 19, the inductor 20, the capacitor 22, and the off capacitance 26. Therefore, the signal that is inputted from the high frequency signal input terminal 1 is outputted from the high frequency signal output terminal 2 with a phase delay which is caused by the all pass network.

In this example, it is assumed that the expression (1) and the expression (2) are satisfied when the capacitance of the off capacitance 26 is $C_1$, the capacitance of the capacitor 22 is $C_2$, the inductance of the inductor 19 and the inductor 20 is L, and the characteristic impedance of the high frequency signal input terminal 1 and the high frequency signal output terminal 2 are $Z_0$. In this case, there is no reflection loss because the all pass network is matched in all of the frequencies. In addition, $C_1$ (or $C_2$) is appropriately set, thereby making it possible to obtain a desired phase delay at a desired frequency.

As described above, the phase shift circuit according to the fourth embodiment shown in FIG. 11 switches between the band pass filter circuit and the all pass network due to the on/off switching operation of the FET 8a and the FET 8b to change the pass phase from the high frequency signal input terminal 1 to the high frequency signal output terminal 2.

Therefore, according to the phase shift circuit of the fourth embodiment, the same effects as those in the phase shift circuit according to the second embodiment can be obtained, and the number of inductors can be reduced by one as compared with the phase shift circuit according to the second embodiment, to thereby make it possible to downsize the phase shift circuit.

In the phase shift circuit according to the fourth embodiment shown in FIG. 11, the FET 8a and the FET 8b are used as the switching elements. However, an element of any type can be applied as long as the element has a switching function that is capable of switching over the on/off states.

Also, the phase shift circuit according to the fourth embodiment shown in FIG. 11 may be structured on the semiconductor substrate in a monolithic fashion. Alternatively, it is possible that a passive element is formed on a dielectric substrate, an active element is formed on a semiconductor substrate, and both of those substrates are electrically connected to each other by a metal wire, a metal bump, or the like to constitute a phase shift circuit.

Fifth Embodiment

Figure 14:
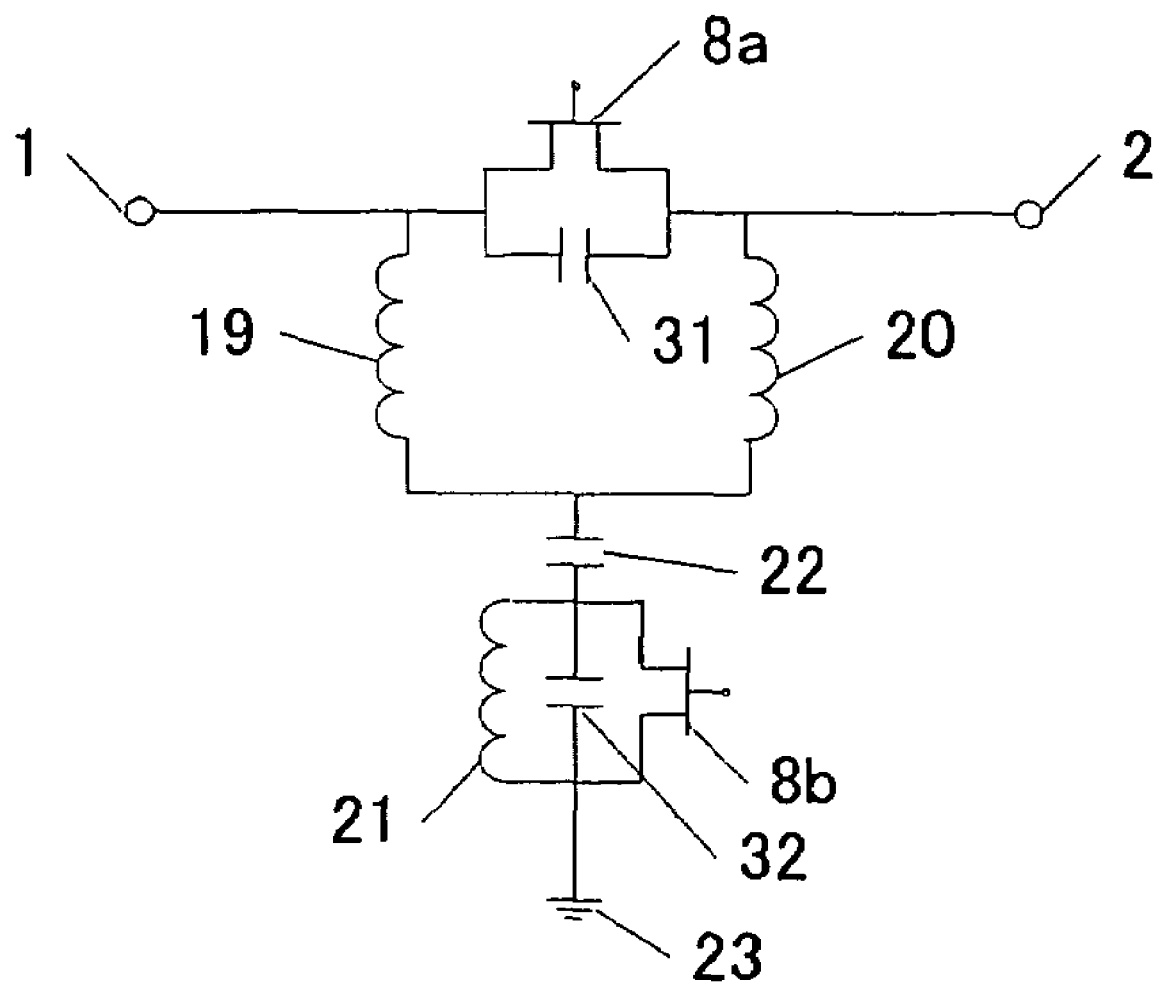
FIG. 14 is a circuit diagram showing a structure of a phase shift circuit according to a fifth embodiment of the present invention.

FIG. 14 is a circuit diagram showing a structure of a phase shift circuit according to a fifth embodiment of the present invention. Referring to FIG. 14, the same parts as or the corresponding parts to those shown in FIG. 5 are denoted by identical reference symbols, and their duplex descriptions will be omitted. ¥In the phase shift circuit according to the fifth embodiment shown in FIG. 14, the FET 8a of the phase shift circuit according to the second embodiment shown in FIG. 5 is connected in parallel with the capacitor 31, and the FET 8b is connected in parallel with the capacitor 32.

In the circuit shown in FIG. 14, the same operation as that in FIG. 6 is conducted when the FET 8a is in an on state and the FET 8b is in an off state. In this situation, in the case of realizing the same capacitance as that of the off capacitance 25, the off capacitance of the FET 8b can be reduced by adding the capacitor 32 as compared with the case of one FET 8b. In other words, the size of the FET 8b can be reduced.

In addition, the same operation as that in FIG. 7 is conducted when the FET 8a is in an off state and the FET 8b is in an on state. In this situation, in the case of realizing the same capacitance as that of the off capacitance 26, the off capacitance of the FET 8a can be reduced by adding the capacitor 31 as compared with the case of one FET 8a. In other words, the size of the FET 8a can be reduced.

As described above, in the phase shift circuit according to the fifth embodiment shown in FIG. 14, the same effects as those in the second embodiment can be obtained, and the size of the FET can be reduced as compared with the phase shift circuit according to the second embodiment, to thereby make it possible to realize the phase shift circuit.

In the phase shift circuit according to the fifth embodiment shown in FIG. 14, the FET 8a and the FET 8b are used as the switching elements. However, an element of any type can be applied as long as the element has a switching function that is capable of switching over the on/off states.

Also, the phase shift circuit according to the fifth embodiment shown in FIG. 14 may be structured on the semiconductor substrate in a monolithic fashion. Alternatively, it is possible that a passive element is formed on a dielectric substrate, an active element is formed on a semiconductor substrate, and both of those substrates are electrically connected to each other by a metal wire, a metal bump, or the like to constitute a phase shift circuit.

Sixth Embodiment

Figure 15:
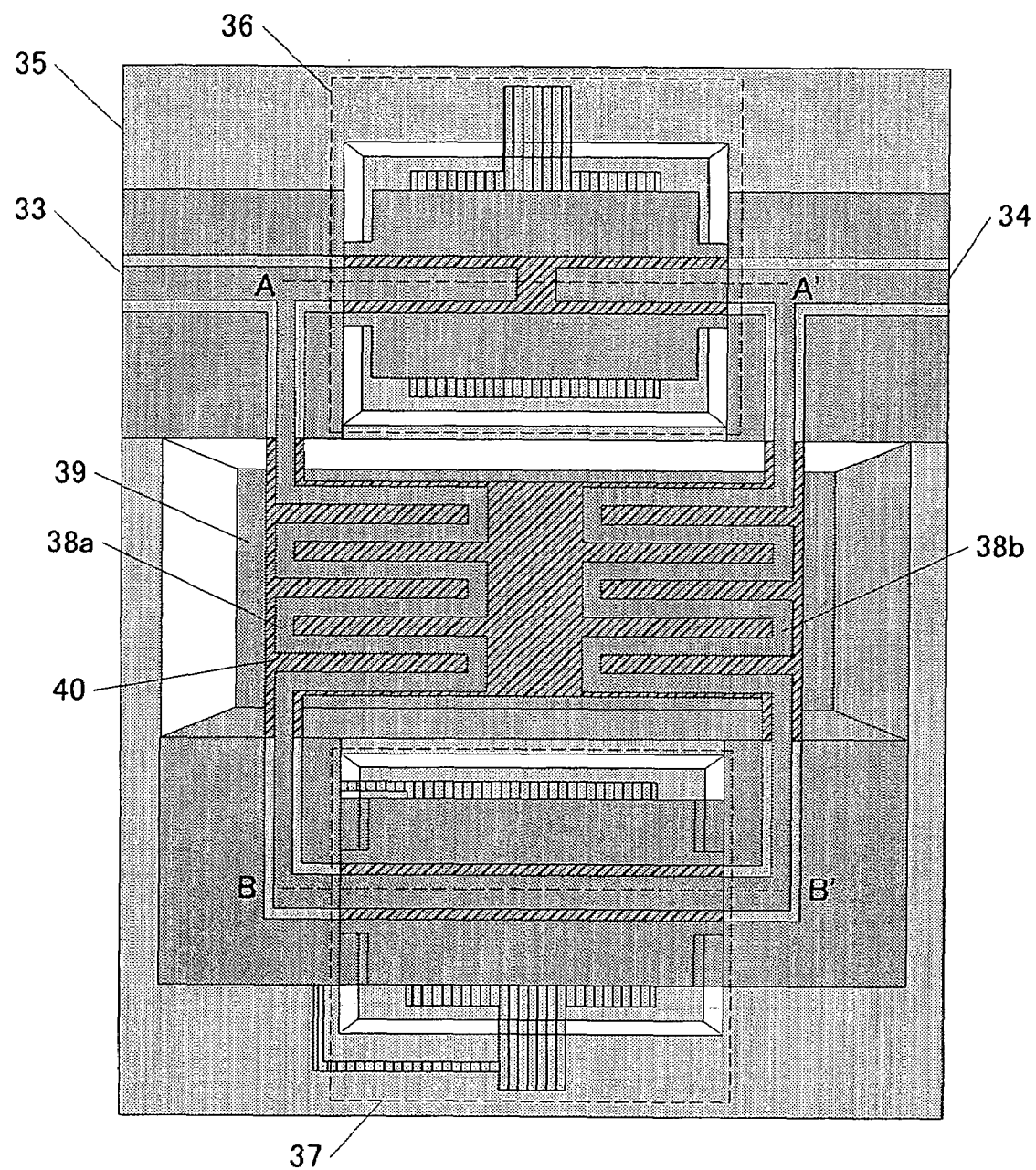
FIG. 15 is a top view showing a structure of a phase shift circuit according to a sixth embodiment of the present invention that is formed on a substrate.

FIG. 15 is a top view showing the structure of a phase shift circuit that is formed on a substrate according to a sixth embodiment of the present invention.

FIG. 15 shows the structure in the case of a coplanar line structure. In the structure, a first dielectric support film 40 is supported by an end portion of a first cavity 39 that is embedded from one surface of the substrate 35 through a fine machining technique, and exists in a hollow through an air layer. Formed on the dielectric support film 40 are a first meander line 38a and a second meander line 38b. An interval between a bottom surface of the cavity 39 and the dielectric support film 40 is several microns to several tens microns. The bottom surface of the cavity 39 may be covered with a metal or not. Reference numeral 33 and 34 denotes a high frequency signal input terminal and a high frequency signal output terminal, and reference numeral 36 and 37 denotes a through/series capacitance switching element and a through/shunt capacitance switching element which are formed on the substrate 35.

Figure 16:
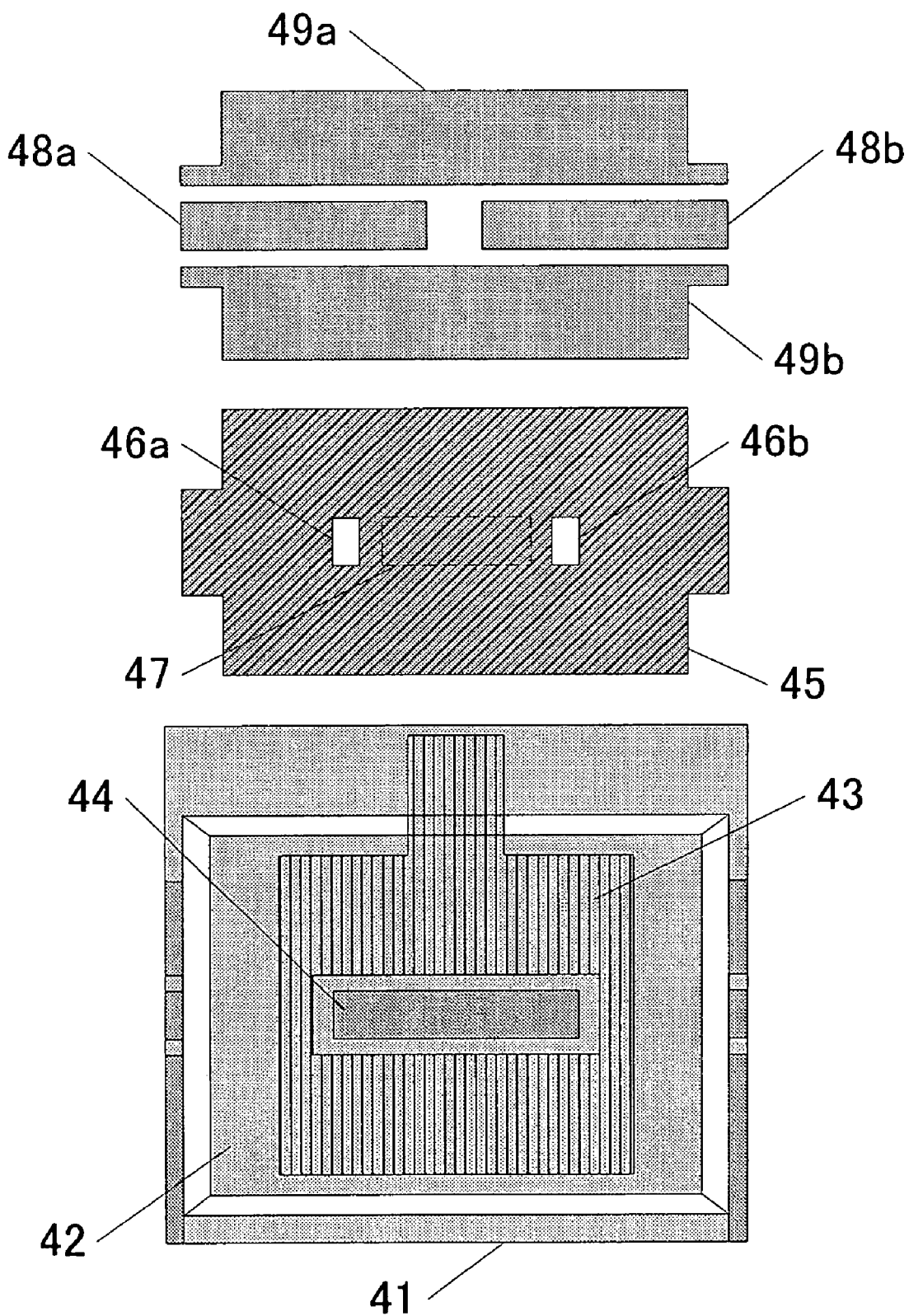
FIG. 16 is an exploded diagram showing a detailed structure of a through/series capacitance switching element 36 shown in FIG. 15.

FIG. 16 is an exploded diagram showing the detailed structure of the through/series capacitance switching element 36 shown in FIG. 15. As shown in FIG. 16, a control electrode 43 and a contact metal 44 are formed on a bottom surface of a second cavity 42 which is embedded from one surface of a substrate 41 (the same as the substrate 35 shown in FIG. 15) through a fine machining technique.

Through holes 46a and 46b are defined in a second dielectric support film 45 that is supported at right and left end portions of the second cavity 42 and exists in the hollow through an air layer, and a metal 47 is formed on a lower surface (back surface) of the second dielectric support film 45. First and second high frequency signal transmission lines 48a and 48b are located on the surface of the second dielectric support film 45 at a distance, and first and second ground metals 49a and 49b are disposed on the surface of the second dielectric support film 45.

The first high frequency signal transmission line 48a, the second high frequency signal transmission line 48b, the first ground metal 49a, and the second ground metal 49b form a coplanar line having a gap in the center thereof. The coplanar line is formed on an upper surface of the second dielectric support film 45. The first high frequency signal transmission line 48a has a metal pattern passing through the second dielectric support film 45 in the through hole 46a portion. Likewise, the second high frequency signal transmission line 48b has a metal pattern passing through the second dielectric support film 45 in the through hole 46b portion. The second dielectric support film 45 having the coplanar line exists in a hollow through the air layer of the second cavity 42, and an interval between the bottom surface of the second cavity 42 and the second dielectric support film 45 is several microns to several tens microns.

Then, the operation of the through/series capacitance switching element 36 shown in FIG. 15 will be described.

Figure 17:
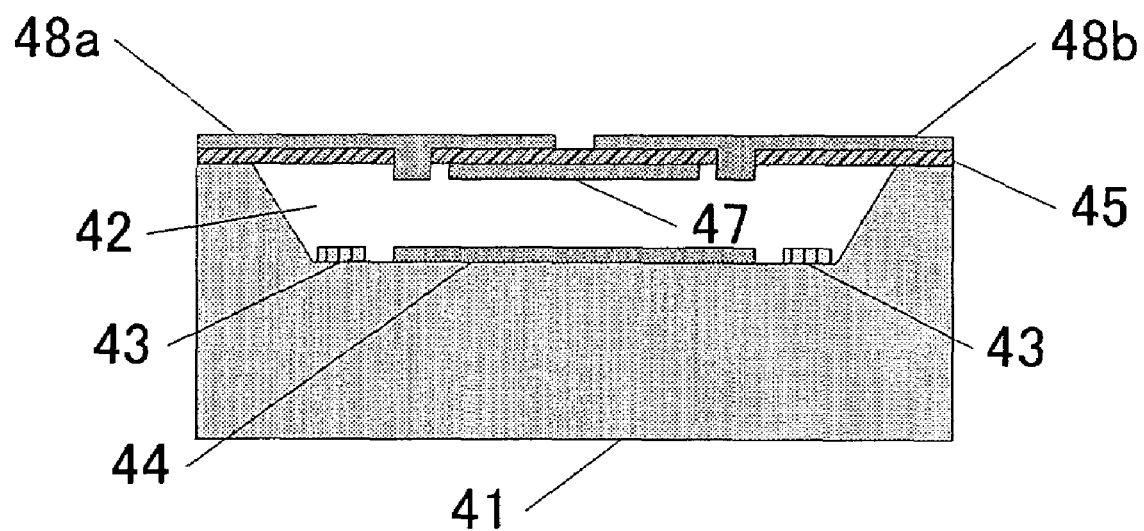
FIG. 17 is a cross-sectional view showing the through/series capacitance switching element 36 taken along the line A-A' shown in FIG. 15 in which no voltage is applied to a control electrode 43.

FIG. 17 is a cross-sectional view showing a through/series capacitance switching element 36 taken along the line A-A' shown in FIG. 15 when no voltage is applied to a control electrode 43. The metal 47, the first high frequency signal transmission line 48a, and the second dielectric support film 45 form a capacitance. Also, the metal 47, the second signal line 48b, and the second dielectric support film 45 also form a capacitance. In other words, a series capacitance state is obtained.

Figure 18:
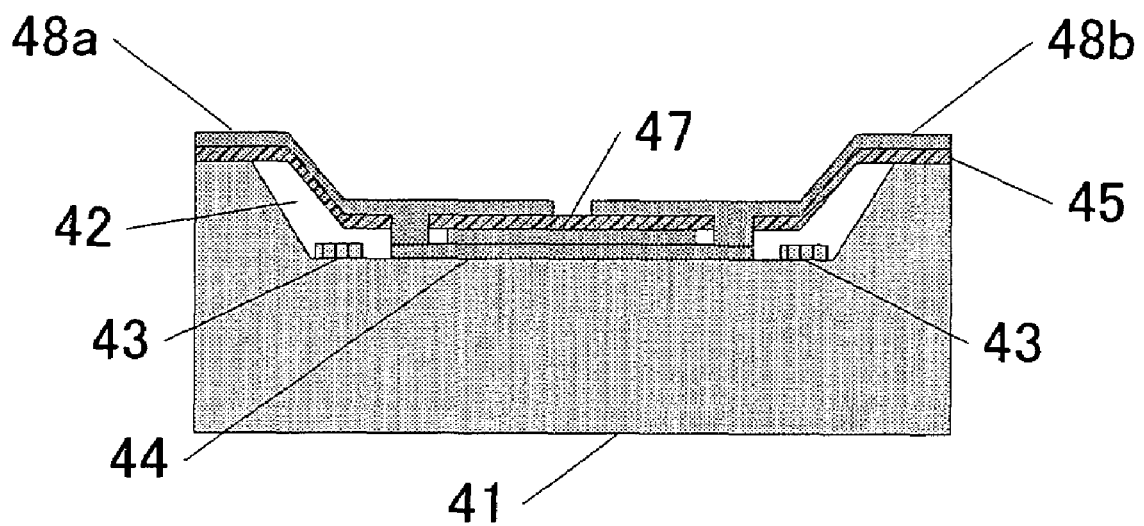
FIG. 18 is a cross-sectional view showing the through/series capacitance switching element 36 taken along the line A-A' shown in FIG. 15 in which a voltage is applied to a first control electrode 43.

Also, FIG. 18 is a cross-sectional view showing a through/series capacitance switching element 36 taken along the line A-A' shown in FIG. 15 when a voltage is applied to a first control electrode 43. An electrostatic attraction force is exerted between a first ground metal 49a and the first control electrode 43 and between a second ground metal 49b and the first control electrode 43 so that the second dielectric support film 45 is displaced toward the bottom surface of the second cavity 42. In this situation, the first high signal transmission line 48a and the second high signal transmission line 48b are rendered conductive through the contact metal 44 to obtain the through state.

Then, the operation of the through/shunt switching element 37 shown in FIG. 15 will be described.

Figure 19:
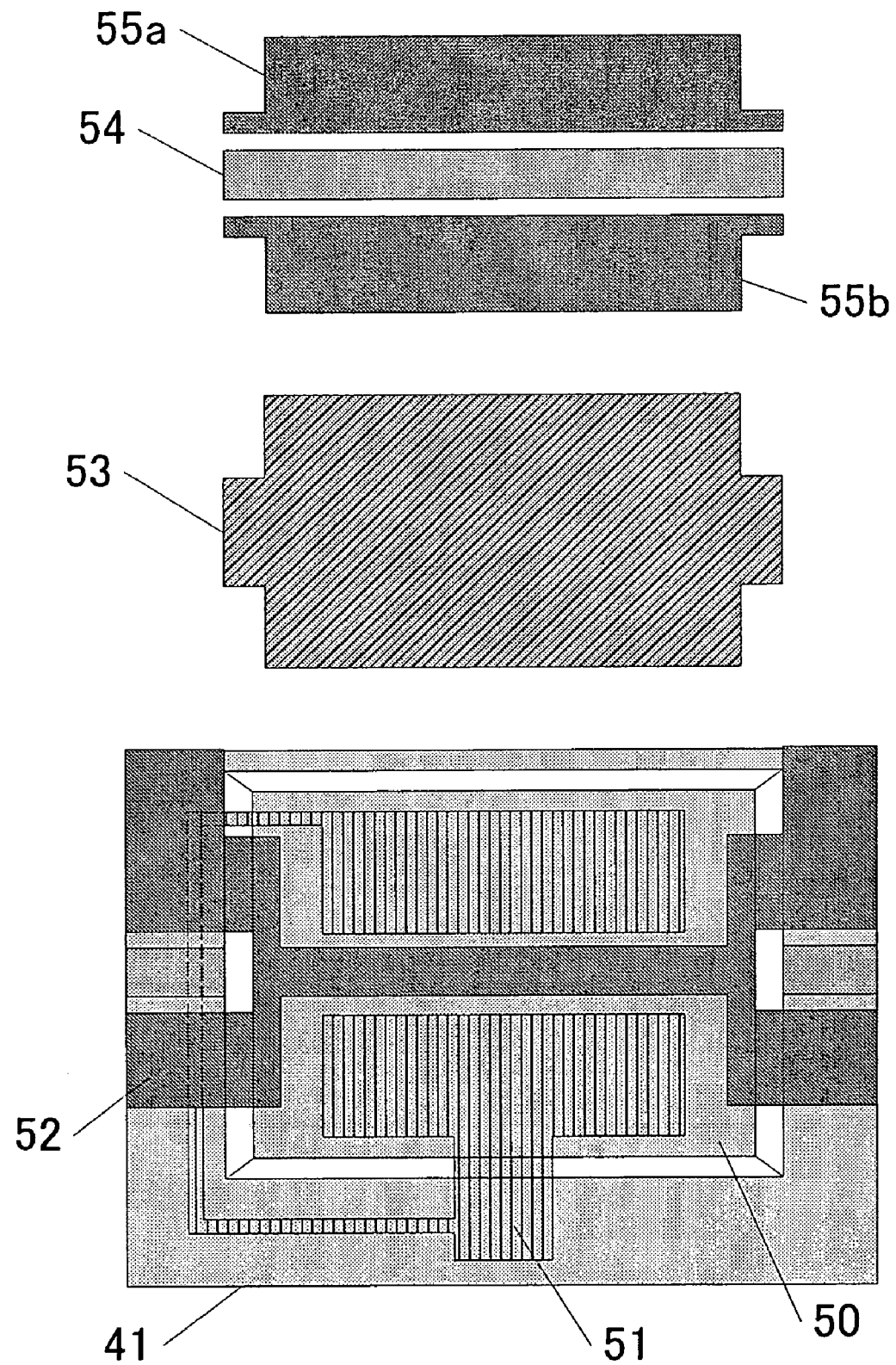
FIG. 19 is an exploded diagram showing a detailed structure of the through/shunt capacitance switching element 37 shown in FIG. 15.

FIG. 19 is an exploded diagram showing the detailed structure of a through/shunt capacitance switching element 37 shown in FIG. 15. As shown in FIG. 19, a second control electrode 51 and a ground metal 52 are formed on a bottom surface of a third cavity 50 which is embedded from one surface of the substrate 41 through a fine machining technique and on the substrate 41. Then, a third dielectric support film 53 is supported at the right and left end portions of the cavity 50 and exists in a hollow through an air layer. Then, a third high frequency signal transmission line 54, a third ground metal 55a, and a fourth ground metal 55b are formed on an upper surface of the dielectric support film 53.

The third high frequency signal transmission line 54, the ground metal 52, the third ground metal 55a, and the fourth ground metal 55b constitute a grounded coplanar line. An interval of several microns to several tens microns are defined between the bottom surface of the third cavity 50 and the third dielectric support film 53.

Figure 20:
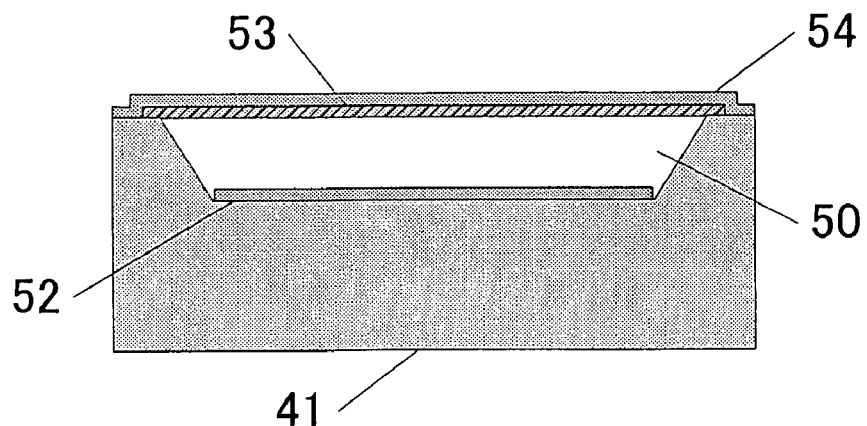
FIG. 20 is a cross-sectional view showing a through/shunt capacitance switching element 37 taken along the line B-B' shown in FIG. 15 in which no voltage is applied to a second control electrode 51.

Then, a description will be given of the operation of the through/shunt capacitance switching element 37 shown in FIG. 15. FIG. 20 is a cross-sectional view showing the through/shunt capacitance switching element 37 taken along the line B-B' shown in FIG. 15 when a voltage is not applied to a second control electrode 51. In this case, the high frequency signal is transmitted through the grounded coplanar. In other words, the through state is obtained.

Figure 21:
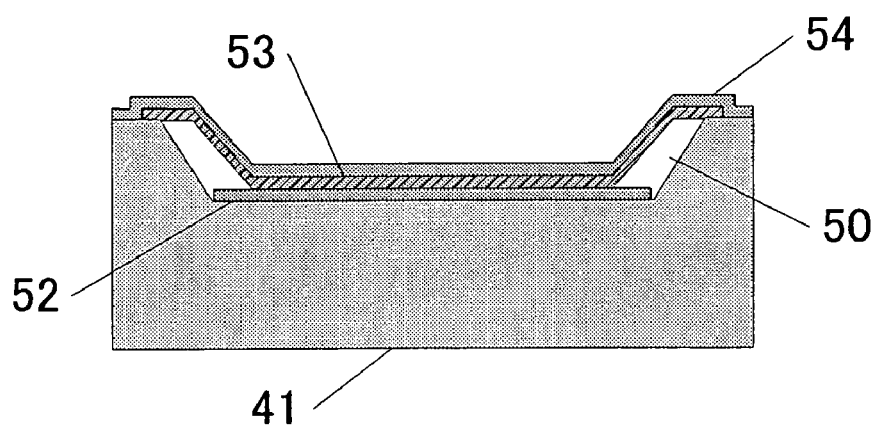
FIG. 21 is a cross-sectional view showing the through/shunt capacitance switching element 37 taken along the line B-B' shown in FIG. 15 in which a voltage is applied to the second control electrode 51.

FIG. 21 is a cross-sectional view showing a through/shunt capacitance switching element 37 taken along the line B-B' shown in FIG. 15 when a voltage is applied to the second control electrode 51. An electrostatic attraction force is exerted between a third ground metal 55a and the second control electrode 51 and between a fourth ground metal 55b and the second control electrode 51 so that the third dielectric support film 53 is displaced toward the bottom surface of the third cavity 50. In this situation, the third high frequency signal transmission line 54 and the ground metal 52 are brought in contact with each other through the third dielectric support film 53. In other words, a state indicative of the capacitance with respect to the ground is obtained.

Subsequently, the operation of the phase shift circuit shown in FIG. 15 will be described.

Figure 22:
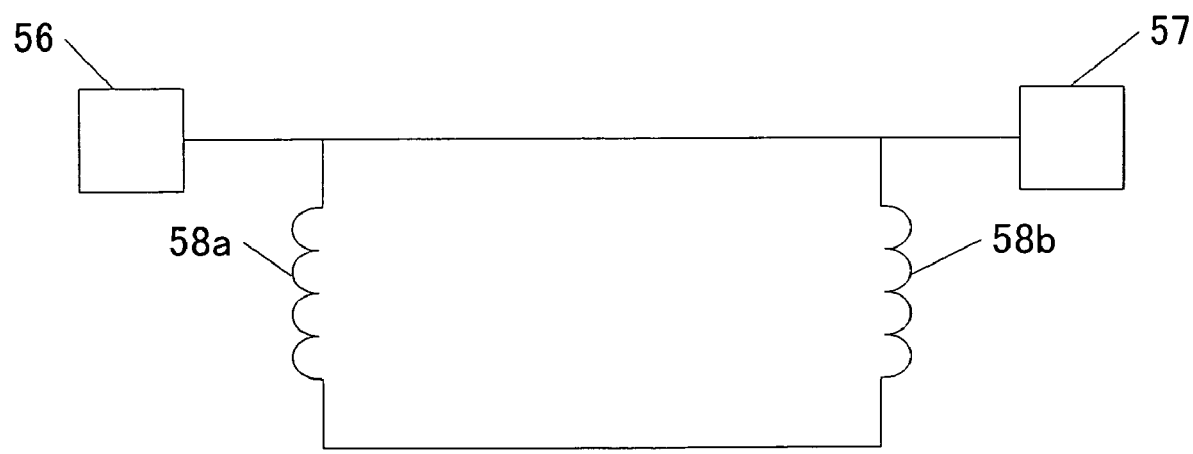
FIG. 22 is an equivalent circuit diagram in which the through/series capacitance switching element 36 is in a through state and the through/shunt capacitance switching element 37 is in a through state in the phase shift circuit shown in FIG. 15.

FIG. 22 is an equivalent circuit diagram when the through/series capacitance switching element 36 is in a through state, and the through/shunt capacitance switching element 37 is in a through state, in the phase shift circuit shown in FIG. 15. In this situation, a voltage is applied to the first control electrode 43, and no voltage is applied to the second control electrode 51 (the same potential as the ground). Reference symbol 56 denotes a terminal corresponding to the high frequency signal input terminal 33, 57 is a terminal corresponding to the high frequency signal output terminal 34, 58a is an inductor corresponding to the first meander line 38a, and 58b is an inductor corresponding to the second meander line 38b.

When it is assumed that the reactance of the inductor 58a and the inductor 58b is sufficiently large, the circuit shown in FIG. 22 can be regarded as a through circuit. Accordingly, a signal that is inputted from the high frequency signal input terminal 56 is outputted from the high frequency signal output terminal 57 without producing a phase change. In this situation, there is no reflection loss because the through circuit is matched in all of the frequencies.

Figure 23:
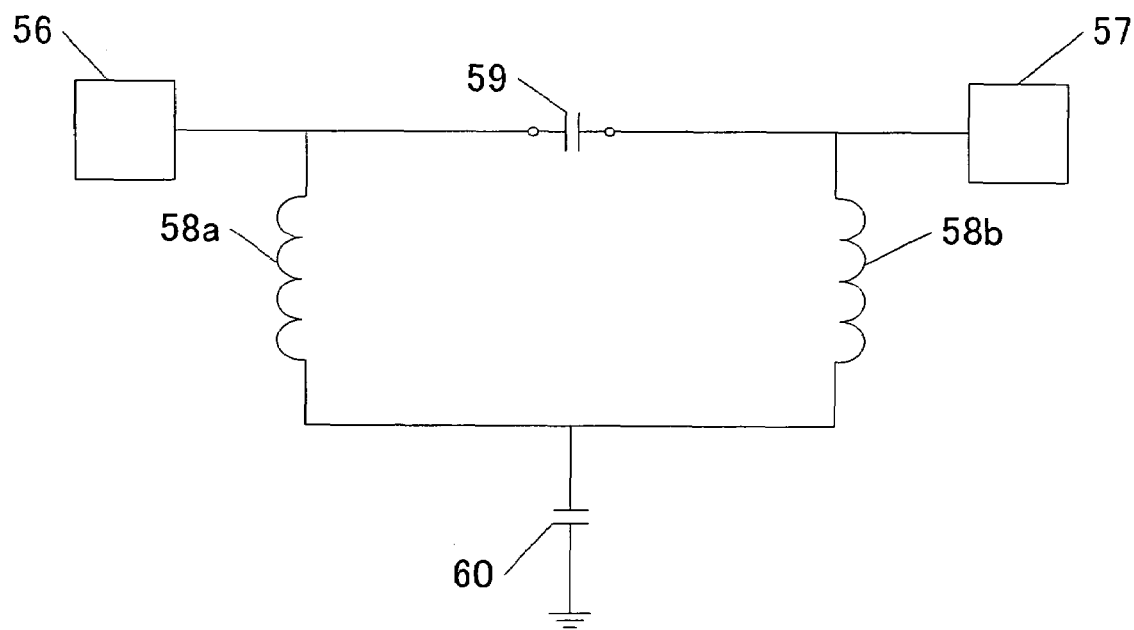
FIG. 23 is an equivalent circuit diagram in which the through/series capacitance switching element 36 is in a series capacitance state and the through/shunt capacitance switching element 37 is in a shunt capacitance state in the phase shift circuit shown in FIG. 15.

Also, FIG. 23 is an equivalent circuit diagram when the through/series capacitance switching element 36 is in a series capacitance state, and the through/shunt capacitance switching element 37 is in a shunt capacitance state, in the phase shift circuit shown in FIG. 15. In this situation, no voltage is applied to the first control electrode 43 (the same potential as the ground), and a voltage is applied to the second control electrode 51. Referring to FIG. 23, the same parts as or the corresponding parts to those shown in FIG. 22 are denoted by identical reference symbols, and their duplex descriptions will be omitted. A capacitor 59 is exhibited when the through/series capacitance switching element 36 is in the series capacitance state, and a capacitor 60 is a capacitor with respect to the ground which is exhibited when the through/shunt capacitance switching element 37 is in the shunt capacitance state.

The circuit shown in FIG. 23 can be regarded as an all pass network that is composed of the inductor 58a, the inductor 58b, the capacitor 59, and the capacitor 60. As a result, the signal that is inputted from the high frequency signal input terminal 56 is outputted from the high frequency signal output terminal 57 with a phase delay caused by the all pass network.

In this example, it is assumed that the expression (1) and the expression (2) are satisfied when the capacitance of the capacitor 59 is $C_1$, the capacitance of the capacitor 60 is $C_2$, the inductance of the inductor 58a and the inductor 58b is L, and the characteristic impedance of the high frequency signal input terminal 56 and the high frequency signal output terminal 57 are $Z_0$.

In this situation, there is no reflection loss because the all pass network is matched in all of the frequencies. In addition, the capacitance $C_1$ (or $C_2$) is appropriately set, thereby making it possible to obtain a desired phase delay.

With the above structure, the phase shift circuit according to the sixth embodiment shown in FIG. 15 switches between the through state and the all pass network state due to the switching operation of the through/series capacitance switching element 36 and the switching operation of the through/shunt capacitance switching element 37, and changes the pass phase occurring when the signal that is inputted from the high frequency signal input terminal 56 is outputted to the high frequency signal output terminal 57.

Therefore, according to the phase shift circuit of the sixth embodiment, the inductance L, the capacitance C1, and the capacitance C2 are appropriately set, thereby making it possible to obtain a desired phase shift amount over a broadband. In other words, there is obtained the phase shift circuit that operates over the broader band than the conventional example.

Also, the phase shift circuit according to the sixth embodiment shown in FIG. 15 obtains the same effects as those in the first to fifth embodiments. In addition, the lower loss is obtained as compared with a case of using the switching element of a semiconductor as in the second to fifth embodiments by using the fine machining technique because the through/series capacitance switching element and the through/shunt capacitance switching element which are mechanically driven are used for the switching element.

In addition, because the hollow structure is applied by using the fine machining technique, the high frequency characteristic is hardly affected by the substrate. In other words, an inexpensive substrate such as a low resistance silicon substrate or a glass substrate can be used, which can reduce the costs as compared with a case of using a semiconductor substrate.

In the phase shift circuit according to the sixth embodiment shown in FIG. 15, a hollow structure meander line of a cavity which is formed by fining one side of the substrate is applied as the inductor. Alternatively, a spiral inductor that is formed by patterning both surfaces of the dielectric support film may be applied. In addition, not the hollow structure but the meander line may be formed on the substrate.

Also, in the through/series capacitance switching element and the through/shunt capacitance switching element, the high frequency signal transmission line is formed on the dielectric support film. Alternatively, a dielectric support film is further formed on the high frequency signal transmission line to constitute a three layer structure. With the above structure, because the metal pattern is interposed between the dielectric support films, a stress is vertically symmetrical and is flat.

Also, it is possible that another substrate where a cavity is formed covers the phase shift circuit from above to provide a package state. As a result, the through/series capacitance switching element and the through/shunt capacitance switching element which are mechanically driven can be shielded from humidity or the like, thereby making it possible to enhance the reliability.

Seventh Embodiment

Figure 24:
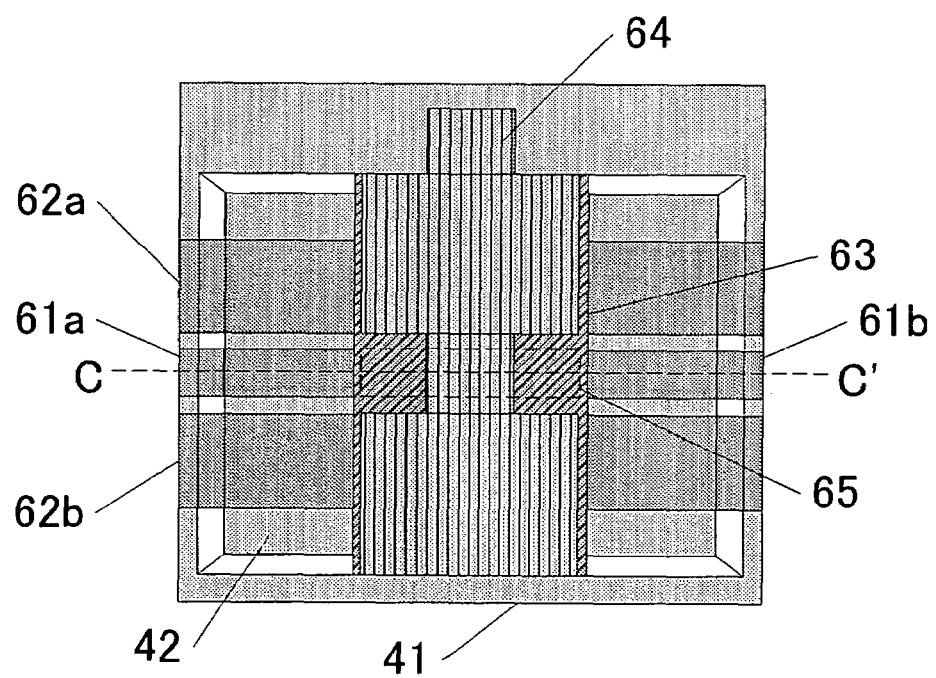
FIG. 24 is a top view showing details of a through/series capacitance switching element in a phase shift circuit according to a seventh embodiment of the present invention.

FIG. 24 is a top view showing the details of a through/series capacitance switching element in a phase shift circuit according to a seventh embodiment of the present invention. The same parts as or the corresponding parts to those shown in FIG. 16 are denoted by identical reference symbols, and their duplex descriptions will be omitted. As shown in FIG. 24, a fifth high frequency signal transmission line 61a, a sixth high frequency signal transmission line 61b, a fifth ground metal 62a, and a sixth ground metal 62b are formed on the bottom surface of the cavity 42 that is embedded in only one surface of the substrate 41 to constitute a coplanar line having a gap in the center thereof.

A fourth dielectric support film 63 is supported by ends of the cavity 42 and exists in a hollow through an air layer of the cavity 42. A third control electrode 64 is formed on the fourth dielectric support film 63, and a contact metal 65 is formed on a rear surface of the fourth dielectric support film 63. An interval of several microns to several tens microns are formed between the bottom surface of the cavity 42 and the fourth dielectric support film 63.

Subsequently, a description will be given of the operation of the through/series capacitance switching element.

Figure 25:
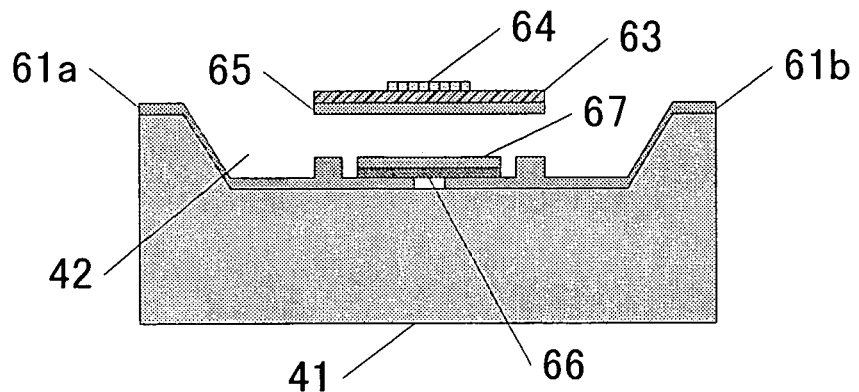
FIG. 25 is a cross-sectional view taken along the line C-C' shown in FIG. 24 in which no voltage is applied to the third control electrode 64.

FIG. 25 is a cross-sectional view taken along the line C-C' shown in FIG. 24 when no voltage is applied to the third control electrode 64. As shown in FIG. 25, a metal 67 is formed on a dielectric film 66, and the metal 67, the fifth high frequency signal transmission line 61a, and the dielectric film 66 form a capacitance. Also, the metal 67, the sixth high frequency signal transmission line 61b, and the dielectric film 66 form a capacitance. In other words, a series capacitance state is obtained.

Figure 26:
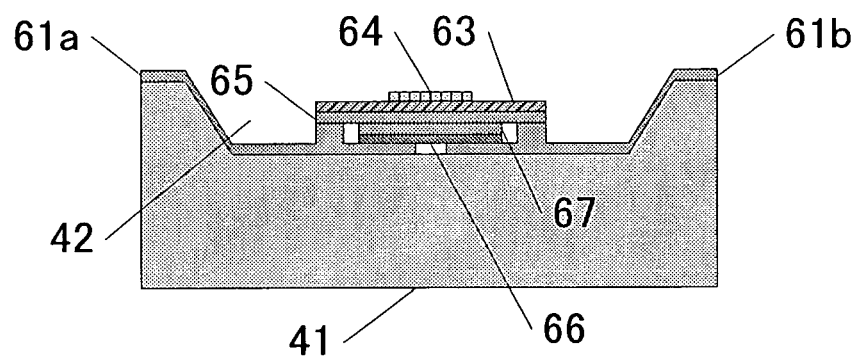
FIG. 26 is a cross-sectional view taken along the line C-C' shown in FIG. 24 in which a voltage is applied to the third control electrode 64.

Also, FIG. 26 is a cross-sectional view taken along the line C-C' shown in FIG. 24 when a voltage is applied to the third control electrode 64. As shown in FIG. 26, an electrostatic attraction force is exerted between the fifth ground metal 62a and the third control electrode 64 and between the sixth ground metal 62b and the third control electrode 64 so that the fourth dielectric support film 63 is displaced toward the bottom surface of the cavity 42. In this situation, the fifth signal transmission line 61a and the sixth signal transmission line 61b are rendered conductive through the contact metal 65 to obtain the through state.

Figure 27:
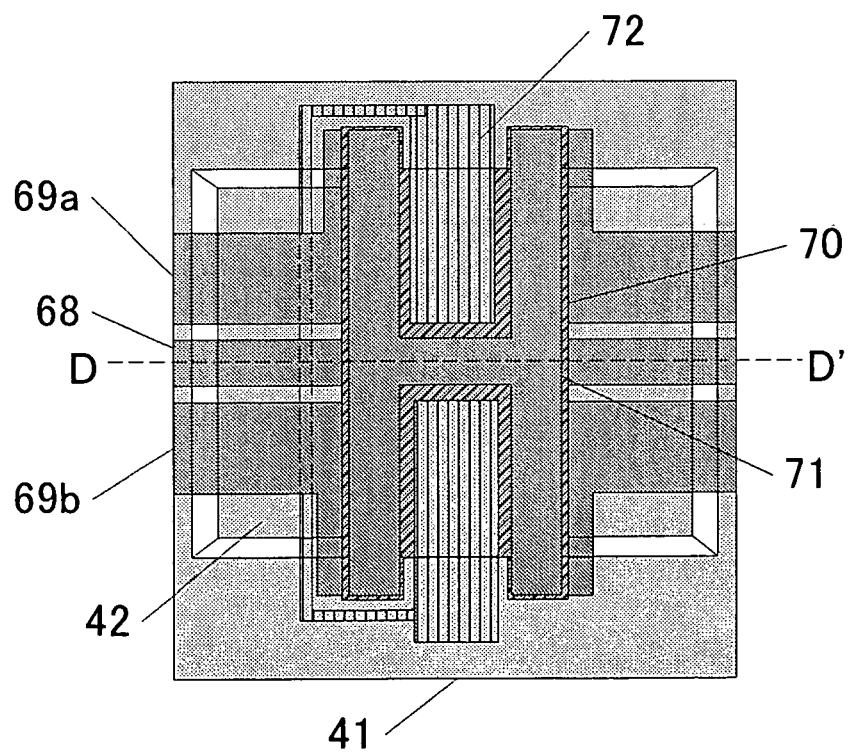
FIG. 27 is a top view showing the details of a through/shunt capacitance switching element in the phase shift circuit according to the seventh embodiment of the present invention.

FIG. 27 is a top view showing the details of a through/shunt capacitance switching element in a phase shift circuit according to the seventh embodiment of the present invention. Referring to FIG. 27, the same parts as or the corresponding parts to those shown in FIG. 24 are denoted by identical reference symbols, and their duplex descriptions will be omitted. As shown in FIG. 27, a seventh high frequency signal transmission line 68, a seventh ground metal 69a, and an eighth ground metal 69b are formed on the bottom surface of the cavity 42 that is embedded in only one surface of the substrate 41, to thereby constitute a coplanar line. A fifth dielectric support film 70 is supported by the ends of the cavity 42 and exists in a hollow through the air layer.

A metal 71 and a fourth control electrode 72 are formed on the fifth dielectric support film 70. An interval between the bottom surface of the cavity 42 and the dielectric support film 70 is several microns to several tens microns. The metal 71, the seventh ground metal 69a, and the eighth ground metal 69b are connected to each other on the substrate 41, and the metal 71 has the same potential as the ground.

Then, a description will be given of the operation of the through/shunt capacitance switching element.

Figure 28:
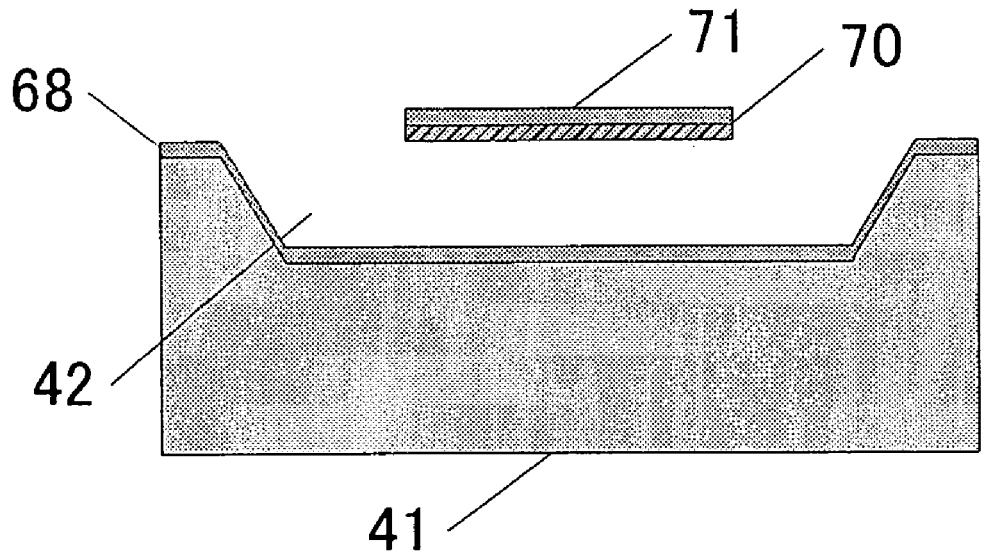
FIG. 28 is a cross-sectional view taken along the line D-D' shown in FIG. 27 in which no voltage is applied to a fourth control electrode 72.

FIG. 28 is a cross-sectional view taken along the line D-D' when no voltage is applied to a fourth control electrode 72 shown in FIG. 27. In this situation, the high frequency signal is transmitted through the coplanar line on the bottom surface of the cavity 42. In other words, the through state is obtained.

Figure 29:
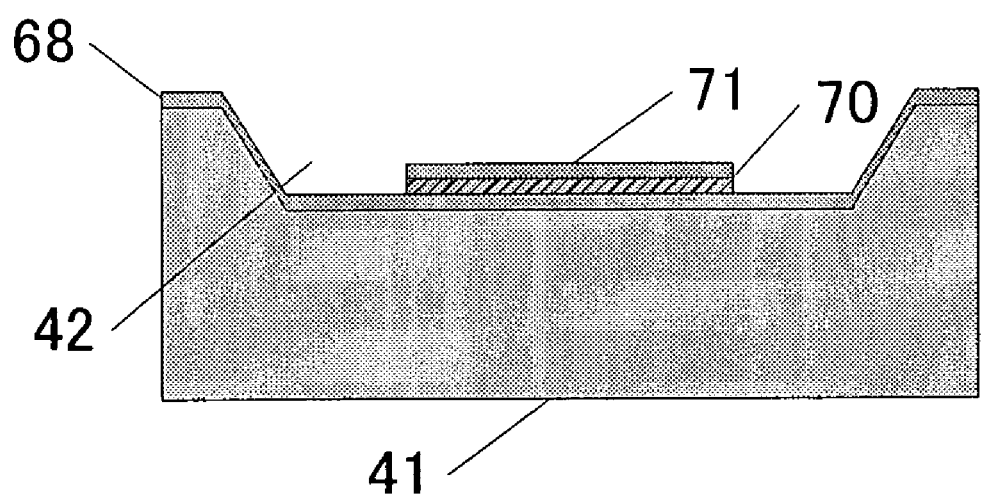
FIG. 29 is a cross-sectional view taken along the line D-D' shown in FIG. 27 in which a voltage is applied to the fourth control electrode 72.

Also, FIG. 29 is a cross-sectional view taken along the line D-D' when a voltage is applied to the fourth control electrode 72 shown in FIG. 27. An electrostatic attraction force is exerted between the seventh ground metal 69a and the fourth control electrode 72 and between the eighth ground metal 69b and the fourth control electrode 72 so that the fourth dielectric support film 70 is displaced toward the bottom surface of the cavity 42. In this situation, the seventh signal transmission line 68 and the metal 71 are brought in contact with each other through the fifth dielectric support film 70. In other words, a state indicative of the capacitance with respect to the ground is obtained.

In the phase shift circuit according to the seventh embodiment, in FIG. 15 showing the phase shift circuit according to the sixth embodiment, the through/series capacitance switching element 36 is replaced with the through/series capacitance switching element shown in FIG. 24, and the through/shunt capacitance switching element 37 is replaced with the through/shunt capacitance switching element shown in FIG. 27. The operation is identical with that in the phase shift circuit according to the sixth embodiment.

As described above, the phase shift circuit according to the seventh embodiment obtains the same effects as those in the first to sixth embodiments. In addition, the lower loss is obtained as compared with a case of using the switching element of a semiconductor as in the second to fifth embodiments by using the fine machining technique because the through/series capacitance switching element and the through/shunt capacitance switching element which are mechanically driven are used for the switching element.

In addition, because the hollow structure is applied by using the fine machining technique, the high frequency characteristic is hardly affected by the substrate. In other words, an inexpensive substrate such as a low resistance silicon substrate or a glass substrate can be used, which can reduce the costs as compared with a case of using a semiconductor substrate.

In the phase shift circuit according to the seventh embodiment, a hollow structure meander line of a cavity which is formed by fining one side of the substrate is applied as the inductor. Alternatively, a spiral inductor that is formed by patterning both surfaces of the dielectric support film may be applied. In addition, not the hollow structure but the meander line may be formed on the substrate.

Also, in the through/series capacitance switching element and the through/shunt capacitance switching element, a metal pattern is formed on the dielectric support film. Alternatively, a dielectric support film is further formed on the metal pattern to constitute a three layer structure. With the above structure, because the metal pattern is interposed between the dielectric support films, a stress is vertically symmetrical and is flat.

Also, it is possible that another substrate where a cavity is formed covers the phase shift circuit from above to provide a package state. As a result, the through/series capacitance switching element and the through/shunt capacitance switching element which are mechanically driven can be shielded from humidity or the like, thereby making it possible to enhance the reliability.

Eighth Embodiment

Figure 30:
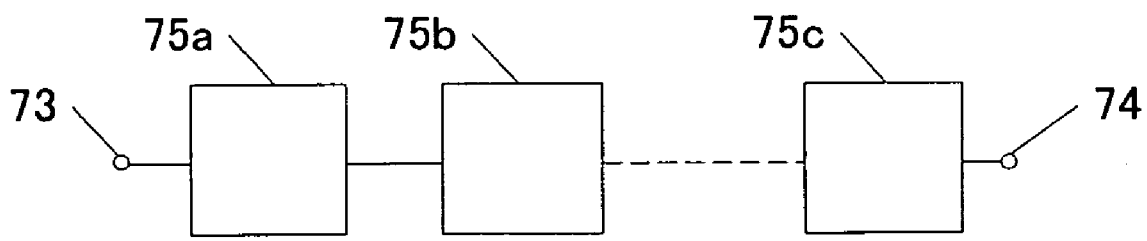
FIG. 30 is a block diagram showing a structure of a phase shifter according to an eighth embodiment of the present invention.
Figure 31:
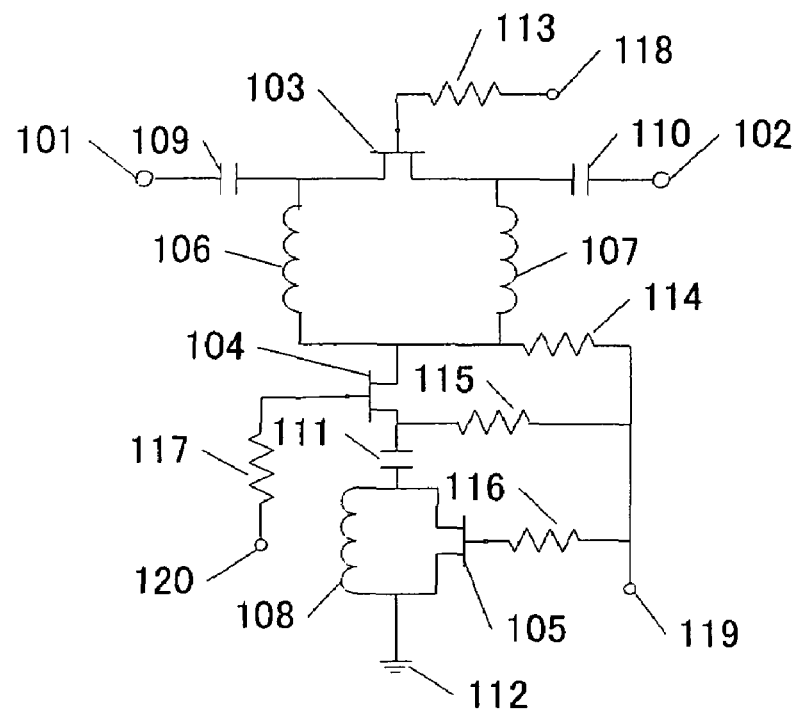
FIG. 31 is a circuit diagram showing a phase shift circuit disclosed in U.S. Pat. No. 6,137,377.
Figure 32:
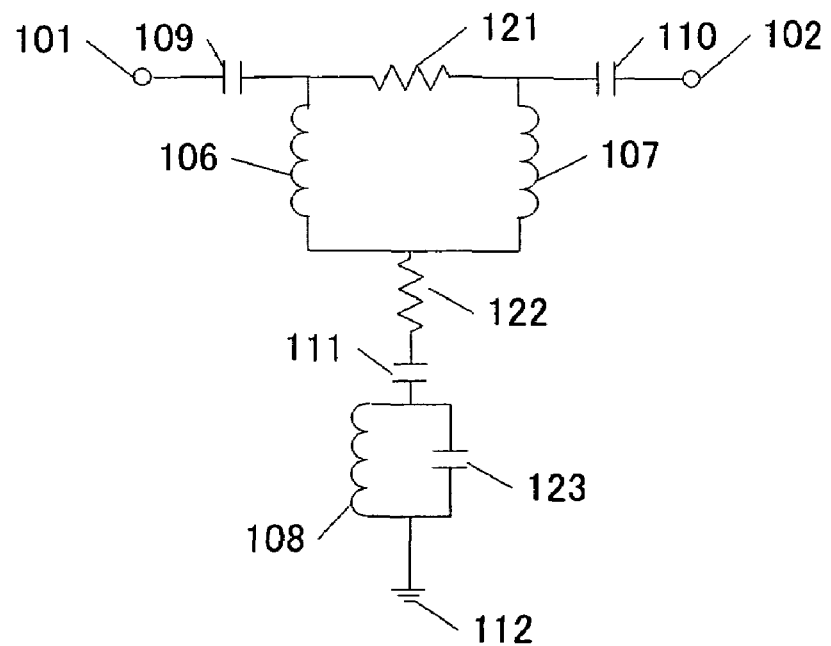
FIG. 32 is an equivalent circuit diagram in which a voltage equal to or lower than a pinch off voltage is applied to a bias terminal 119 of FIG. 31.
Figure 33:
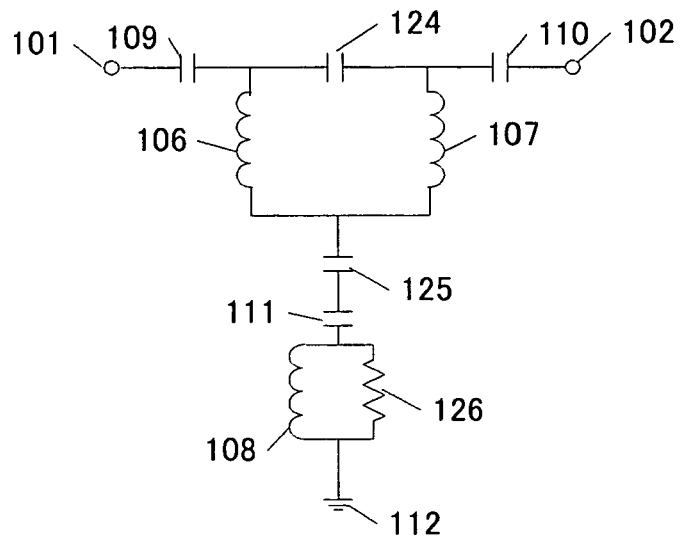
FIG. 33 is an equivalent circuit diagram in which 0 V is applied to the bias terminal 119 of FIG. 31.
Figure 34:
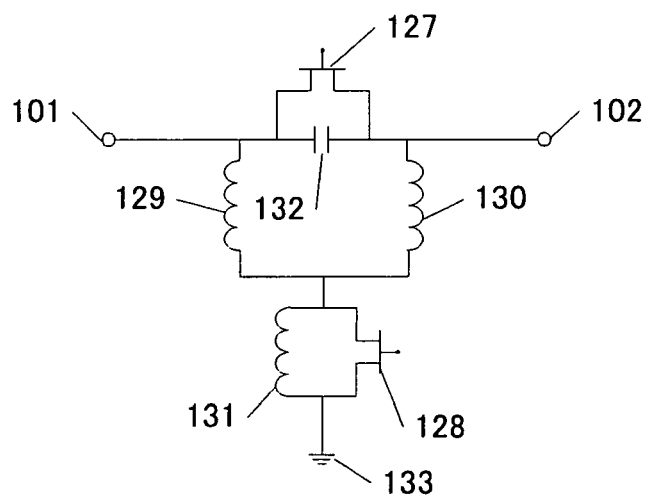
FIG. 34 is a circuit diagram showing a conventional phase shift circuit disclosed in IEEE IMS2000 Proceedings, "A Compact 5-Bit Phase Shifter MMIC for K-Band Satellite Communication Systems"
Figure 35:
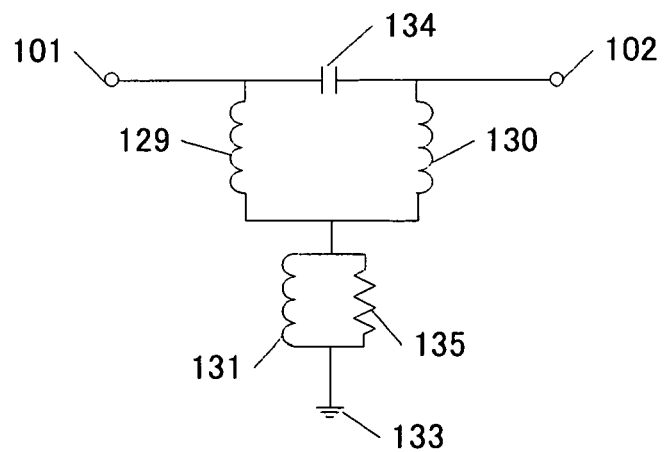
Figure 36:
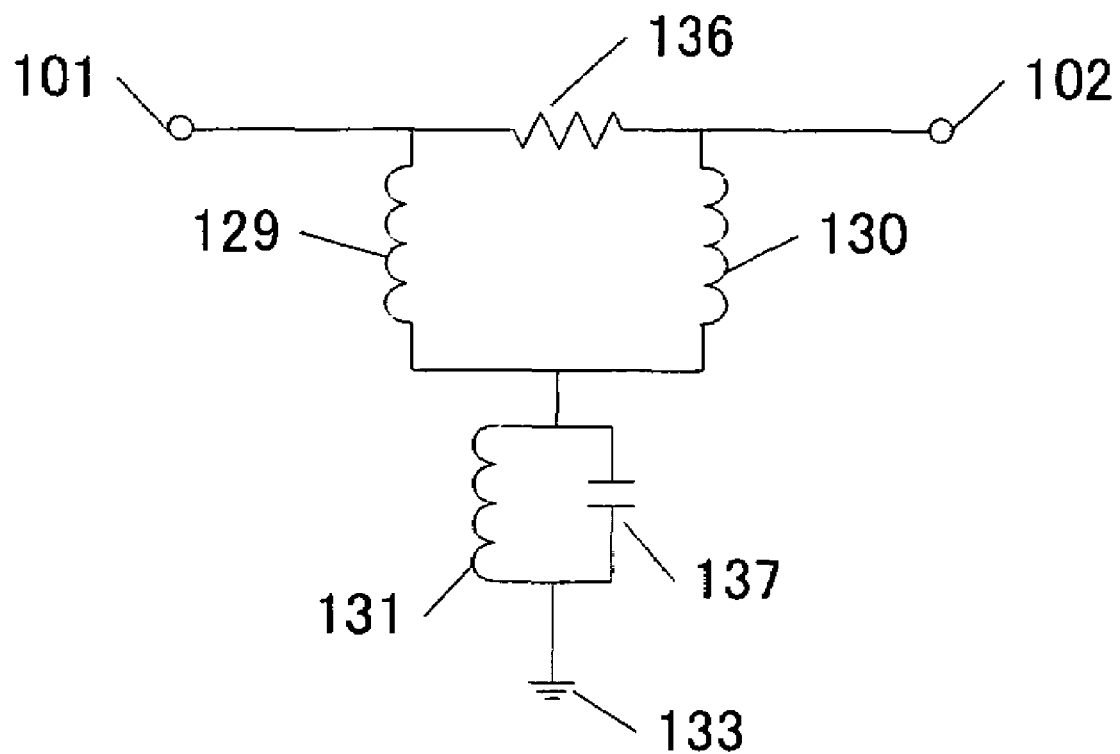
FIG. 36 is an equivalent circuit diagram in which the first FET 127 of FIG. 34 is turned on and the second FET 128 of FIG. 34 is turned off.

FIG. 30 is a block diagram showing a structure of a phase shifter according to an eighth embodiment of the present invention. In the phase shifter shown in FIG. 30, a plurality of phase shift circuits 75 (75a, 75b, 75c) for one bit are connected in a multistage manner between a high frequency signal input terminal 73 and a high frequency signal output terminal 74. In this example, the phase shift circuits 75 use the phase shift circuits of the first to seventh embodiments. The phase shift circuits 75 for one bit are connected in the multistage manner to constitute the phase shifter, thereby making it possible to realize a phase shifter that operates with multi-bits.

INDUSTRIAL APPLICABILITY

As described above, according to the present invention, it is possible to obtain a phase shift circuit which is downsized and has a broadband phase shift amount characteristic, and a high frequency switch that is used for the phase shift circuit. Also, it is possible to realize a multi-bit phase shifter which is downsized and has a broadband phase shift amount characteristic.

The invention claimed is:

1. A phase shift circuit, comprising:
   a first switching element for switching between a through path and a capacitor of a capacitance $C_1$;
   a second switching element for switching between a through path and a capacitor of a capacitance $C_2$ with respect to a ground; and
   first and second inductors each having an inductance L,
   wherein one ends of the first and second switching elements are connected to each other through the first inductor, the other ends of the first and second switching elements are connected to each other through the second inductor, the one end of the first switching element is connected to a high frequency signal input terminal, the other end of the first switching element is connected to a high frequency signal output terminal, and following expressions are satisfied assuming that a characteristic impedance of the high frequency signal input terminal and the high frequency output terminal is $Z_0$:

$$C_2 = 4C_1 \quad (1)$$

$$Z_0 = (L/2C_1)^{1/2} \quad (2).$$

2. The phase shift circuit according to claim 1, characterized in that:
   the first switching element is constituted by a switching element that is indicative of a through state at a time of on and a capacitivity at a time of off;
   the second switching element is constituted by a parallel circuit in which an inductor is connected in parallel with a switching element indicative of a through state at the time of on and a capacitivity at the time of off, and a series circuit composed of the parallel circuit and the capacitance of the capacitor; and
   one end of the series circuit is connected to the ground, and the other end of the series circuit is connected to the other ends of the first and second inductors.

3. The phase shift circuit according to claim 2, characterized in that the capacitance of the capacitor is constituted by a switching element indicative of the through state at the time of on and the capacitivity at the time of off.

4. The phase shift circuit according to claim 2, characterized in that the parallel circuit is replaced with a switching element indicative of the through state at the time of on and the capacitivity at the time of off.

5. The phase shift circuit according to claim 2, characterized in that the switching element indicative of the through state at the time of on and the capacitivity at the time of off is replaced with a parallel circuit that includes a switching element indicative of the through state at the time of on and the capacitivity at the time of off, and a capacitor.

6. The phase shift circuit according to claim 1, wherein the first switching element comprises:
   a first conductor and a control electrode that are formed on a bottom surface of a cavity embedded in only one surface of a substrate;
   a dielectric support film that is supported by end portions of the cavity and exists in a hollow through an air layer;
   a pair of high frequency signal transmission lines formed to be apart from each other at an interval on the support film surface; and
   a second conductor that is disposed on a rear surface of the support film and forms a parallel plane capacitor between the pair of high frequency signal transmission paths,
   wherein each of the pair of high frequency signal transmission lines has a conductive projection penetrating a part of the support film, and when a voltage is applied to the control electrode, the support film is displaced toward the bottom surface of the cavity and each of the conductive projections is brought in contact with the first conductor to provide a through state, such that a through/series capacitance switching element that is mechanically driven is structured.

7. The phase shift circuit according to claim 1, wherein the second switching element comprises:
   a ground conductor and a control electrode which are formed on a bottom surface of a cavity embedded in only one surface of a substrate;
   a dielectric support film that is supported by end portions of the cavity and exists in a hollow through an air layer; and
   a high frequency signal transmission line that is formed on the support film surface,
   wherein when a voltage is applied to the control electrode, the support film is displaced toward the bottom surface of the cavity and the support film is brought in contact with the ground conductor to provide a state indicative of the capacitance with respect to the ground, such that a through/shunt capacitance switching element that is mechanically driven is structured.

8. The phase shift circuit according to claim 1, wherein the first switching element comprises:
   a pair of high frequency signal transmission lines formed to be apart from each other at an interval on a bottom surface of a cavity that is embedded in only one surface of a substrate and have a conductive projection, respectively;
   a dielectric film that is formed on the pair of high frequency signal transmission lines to extend across the pair of high frequency signal transmission lines;
   a first conductor formed on the dielectric film;

a dielectric support film supported by end portions of the cavity and exists in a hollow through an air layer;

a second conductor formed on a rear surface of the support film; and a control electrode formed on the support film surface, wherein when a voltage is applied to the control electrode, the support film is displaced toward the bottom surface of the cavity and the second conductor is brought in contact with the respective conductive projections to provide a through state, such that a through/series capacitance switching element that is mechanically driven is structured.

9. The phase shift circuit according to claim 1, wherein the second switching element comprises, comprising:

a high frequency signal transmission line that is formed on a bottom surface of a cavity embedded in only one surface of a substrate;

a dielectric support film that is supported by end portions of the cavity and exists in a hollow through an air layer; and a ground conductor and a control electrode that are formed on the support film surface, wherein when a voltage is applied to the control electrode, the support film is displaced toward the bottom surface of the cavity, and the support film is brought in contact with the high frequency signal transmission line to provide a state indicative of a capacitance with respect to a ground, such that a through/shunt capacitance switching element that is mechanically driven is structured.

10. The phase shift circuit according to claim 1, characterized in that:

the first switching element comprises the high frequency switch according to claim 6 or 8; and the second switching element comprises the high frequency switch according to claim 7 or 9.

11. A multi-bit phase shifter characterized by comprising a combination of the phase shift circuits according to any one of claims 1 to 5.

12. A multi-bit phase shifter characterized by comprising a combination of the phase shift circuits according to claim 10.

* * * * *